United States Patent
Dairiki et al.

(10) Patent No.: US 8,288,773 B2
(45) Date of Patent: Oct. 16, 2012

(54) WIRELESS CHIP AND MANUFACTURING METHOD THEREOF

(75) Inventors: Koji Dairiki, Isehara (JP); Junya Maruyama, Ebina (JP); Tomoko Tamura, Atsugi (JP); Eiji Sugiyama, Tochigi (JP); Yoshitaka Dozen, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 903 days.

(21) Appl. No.: 11/660,165

(22) PCT Filed: Aug. 10, 2005

(86) PCT No.: PCT/JP2005/014967
§ 371 (c)(1),
(2), (4) Date: Feb. 14, 2007

(87) PCT Pub. No.: WO2006/022169
PCT Pub. Date: Mar. 2, 2006

(65) Prior Publication Data
US 2008/0093464 A1   Apr. 24, 2008

(30) Foreign Application Priority Data
Aug. 23, 2004   (JP) .................................. 2004-242994

(51) Int. Cl.
*H01L 29/76*   (2006.01)
(52) U.S. Cl. ............... 257/66; 257/72; 257/59; 257/187
(58) Field of Classification Search ............ 257/72, 257/59, 187, 66
See application file for complete search history.

(56) References Cited

U.S. PATENT DOCUMENTS 5,587,330 A  * 12/1996 Yamazaki .................... 438/162
6,224,965 B1    5/2001 Haas et al.
(Continued)

FOREIGN PATENT DOCUMENTS
EP         1 092 739        4/2001
(Continued)

OTHER PUBLICATIONS

Taiwanese Office Action (Application No. 094128606) Dated May 11, 2012.
(Continued)

*Primary Examiner* — Samuel Gebremariam
(74) *Attorney, Agent, or Firm* — Eric J. Robinson; Robinson Intellectual Property Law Office, P.C.

(57) ABSTRACT

It is an object of the present invention to reduce the cost of a wireless chip, further, to reduce the cost of a wireless chip by enabling the mass production of a wireless chip, and furthermore, to provide a downsized and lightweight wireless chip. A wireless chip in which a thin film integrated circuit peeled from a glass substrate or a quartz substrate is formed between a first base material and a second base material is provided according to the invention. As compared with a wireless chip formed from a silicon substrate, the wireless chip according to the invention realizes downsizing, thinness, and lightweight. The thin film integrated circuit included in the wireless chip according to the invention at least has an n-type thin film transistor having an LDD (Lightly Doped Drain) structure, a p-type thin film transistor having a single drain structure, and a conductive layer functioning as an antenna.

48 Claims, 26 Drawing Sheets

U.S. PATENT DOCUMENTS

| | | |
|---|---|---|
| 6,388,291 B1 | 5/2002 | Zhang et al. |
| 6,403,221 B1 | 6/2002 | Nakamura et al. |
| 6,433,361 B1 | 8/2002 | Zhang et al. |
| 6,556,257 B2 * | 4/2003 | Ino ................................ 349/43 |
| 6,586,766 B2 * | 7/2003 | Yamazaki et al. ............. 257/57 |
| 6,887,650 B2 | 5/2005 | Shimoda et al. |
| 6,933,574 B2 | 8/2005 | Park et al. |
| 7,037,752 B2 | 5/2006 | Kuwabara et al. |
| 7,045,442 B2 | 5/2006 | Maruyama et al. |
| 7,049,178 B2 | 5/2006 | Kim et al. |
| 7,169,636 B2 | 1/2007 | Maruyama et al. |
| 7,407,870 B2 | 8/2008 | Maruyama et al. |
| 7,485,489 B2 | 2/2009 | Björbell |
| 7,906,780 B2 | 3/2011 | Iwasaki |
| 2001/0015256 A1 | 8/2001 | Yamazaki et al. |
| 2003/0022403 A1 | 1/2003 | Shimoda et al. |
| 2003/0104659 A1 | 6/2003 | Arakawa et al. |
| 2003/0132430 A1 * | 7/2003 | Tsai ................................ 257/2 |
| 2003/0162312 A1 | 8/2003 | Takayama et al. |
| 2004/0063256 A1 | 4/2004 | Ishikawa |
| 2004/0129450 A1 | 7/2004 | Yamazaki et al. |
| 2004/0129960 A1 | 7/2004 | Maruyama et al. |
| 2004/0233374 A1 | 11/2004 | Yamazaki et al. |
| 2004/0238827 A1 | 12/2004 | Takayama et al. |
| 2004/0239827 A1 | 12/2004 | Yamazaki et al. |
| 2005/0051870 A1 | 3/2005 | Yamazaki et al. |
| 2005/0056842 A1 | 3/2005 | Nishi et al. |
| 2005/0070038 A1 | 3/2005 | Yamazaki et al. |
| 2005/0090075 A1 | 4/2005 | Takayama et al. |
| 2005/0106839 A1 | 5/2005 | Shimoda et al. |
| 2005/0112805 A1 | 5/2005 | Goto et al. |
| 2005/0167573 A1 | 8/2005 | Maruyama et al. |
| 2005/0233122 A1 | 10/2005 | Nishimura et al. |
| 2005/0285231 A1 | 12/2005 | Arao et al. |
| 2005/0287846 A1 | 12/2005 | Dozen et al. |
| 2006/0189097 A1 | 8/2006 | Maruyama et al. |
| 2008/0044940 A1 | 2/2008 | Watanabe et al. |

FOREIGN PATENT DOCUMENTS

| | | |
|---|---|---|
| EP | 1434263 A | 6/2004 |
| EP | 1 435 653 | 7/2004 |
| EP | 1 437 683 | 7/2004 |
| EP | 1 455 394 | 9/2004 |
| JP | 10-092980 | 4/1998 |
| JP | 2001-237260 A | 8/2001 |
| JP | 2004-064056 A | 2/2004 |
| JP | 2004/094492 | 3/2004 |
| JP | 2004-221561 A | 8/2004 |
| JP | 2004-221570 | 8/2004 |
| TW | 200403945 | 3/2004 |
| TW | 1220538 | 8/2004 |
| WO | WO 01/01740 | 1/2001 |
| WO | WO-03/010825 | 2/2003 |
| WO | WO 2004/001848 | 12/2003 |
| WO | WO-2007/086291 | 8/2007 |

OTHER PUBLICATIONS

International Search Report (Application No. PCT/JP2005/014967) dated Nov. 15, 2005.

Written Opinion (Application No. PCT/JP2005/014967) dated Nov. 15, 2005.

* cited by examiner

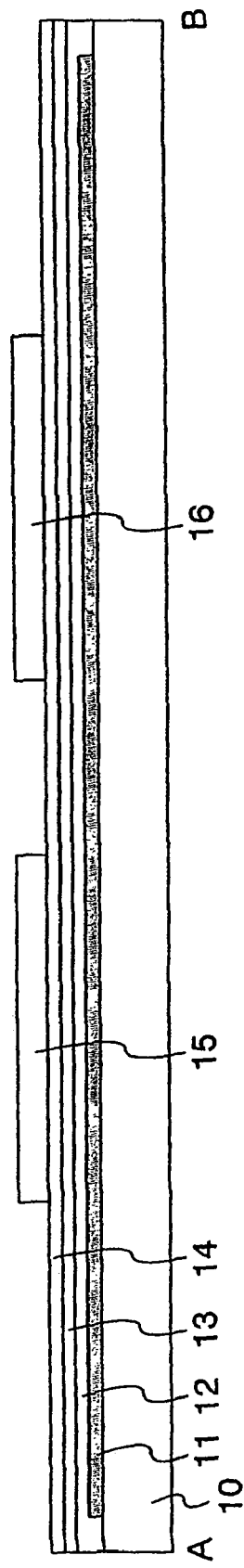
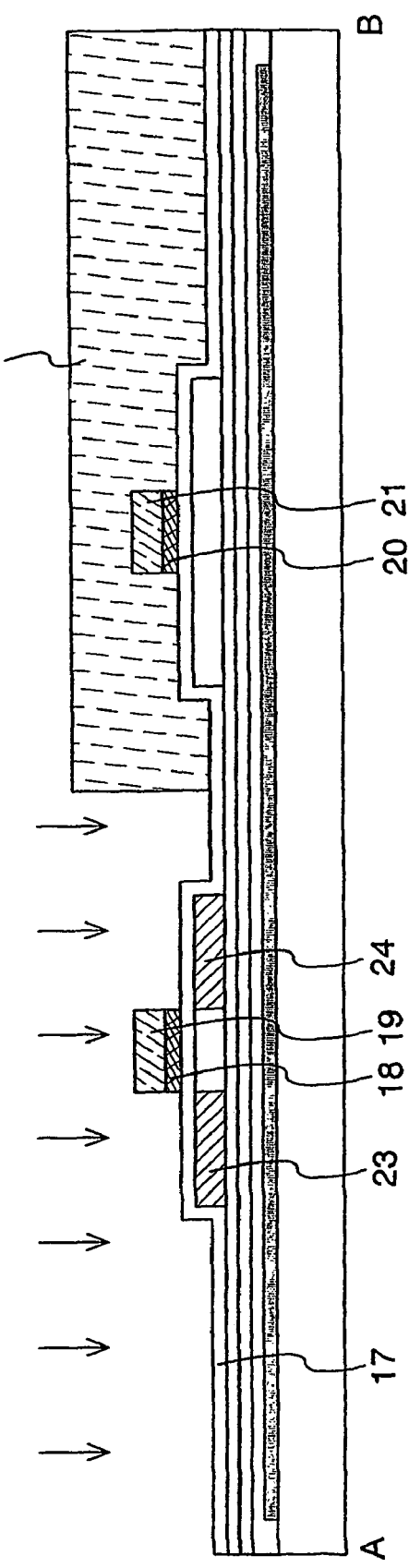
FIG. 2A
FIG. 2B

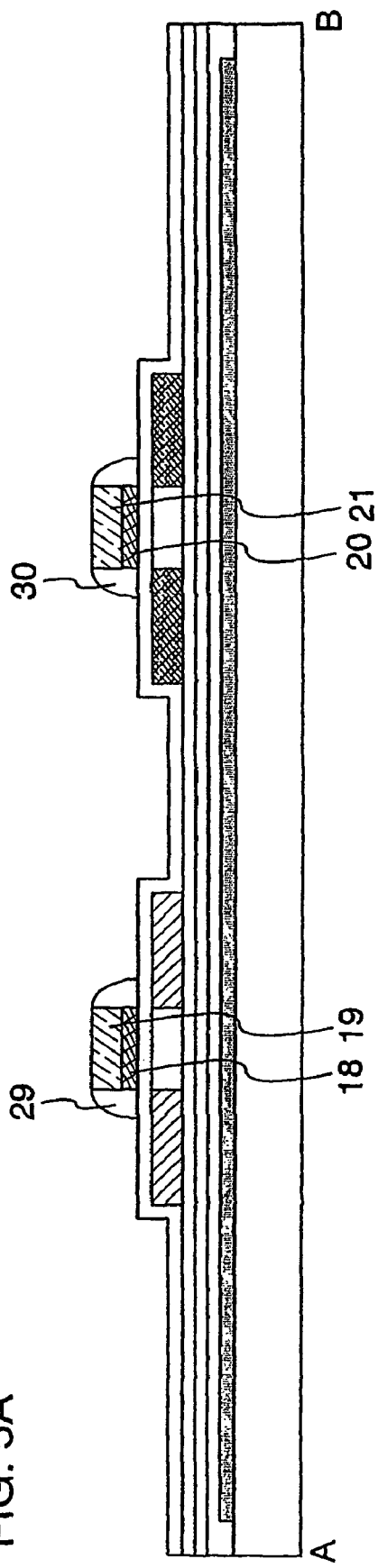
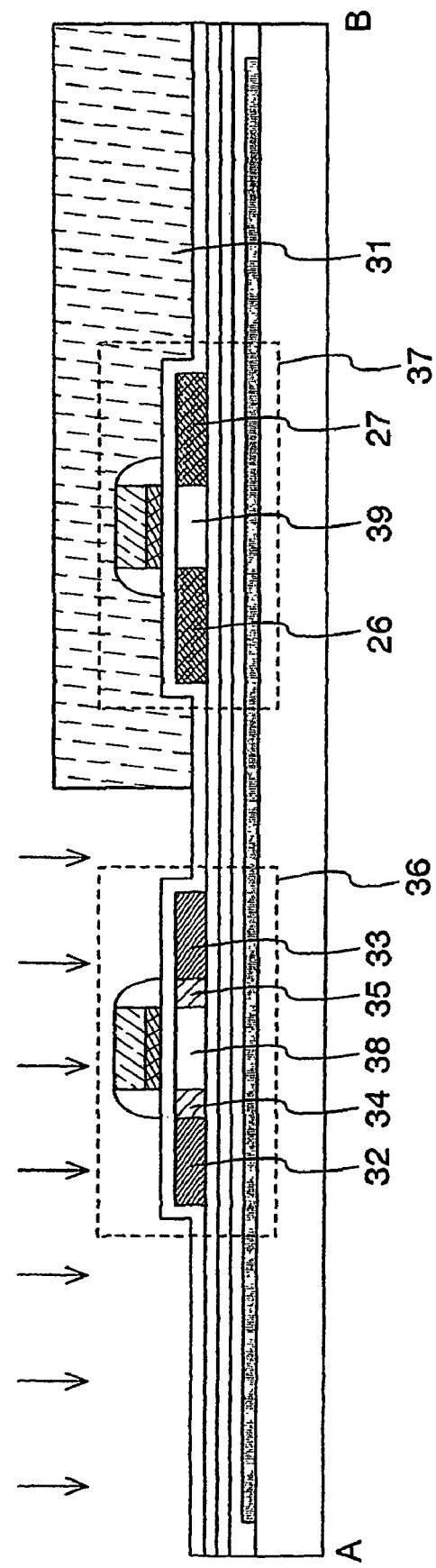
FIG. 5A
FIG. 5B

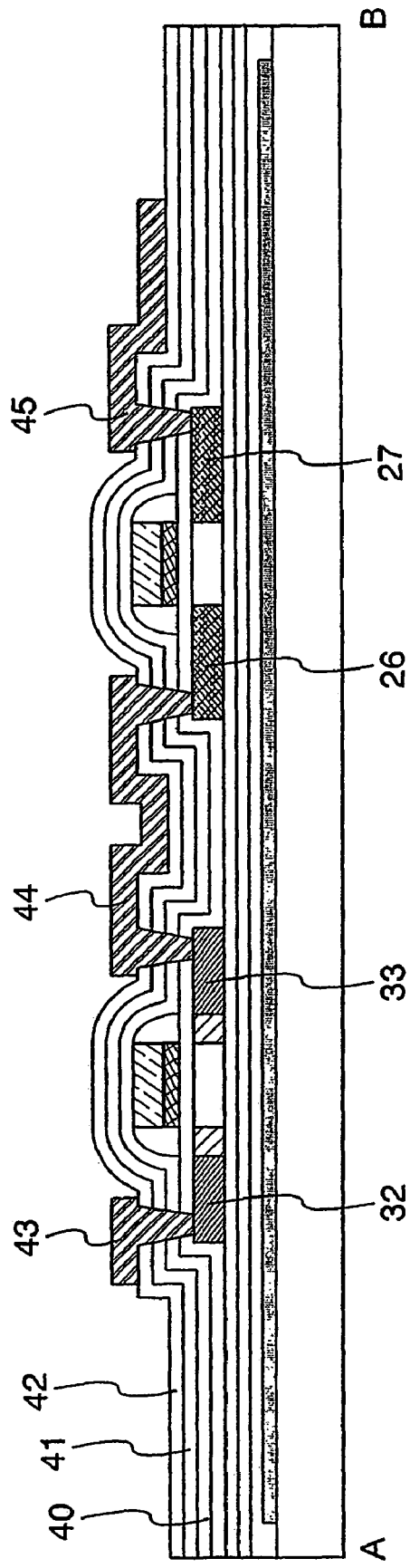
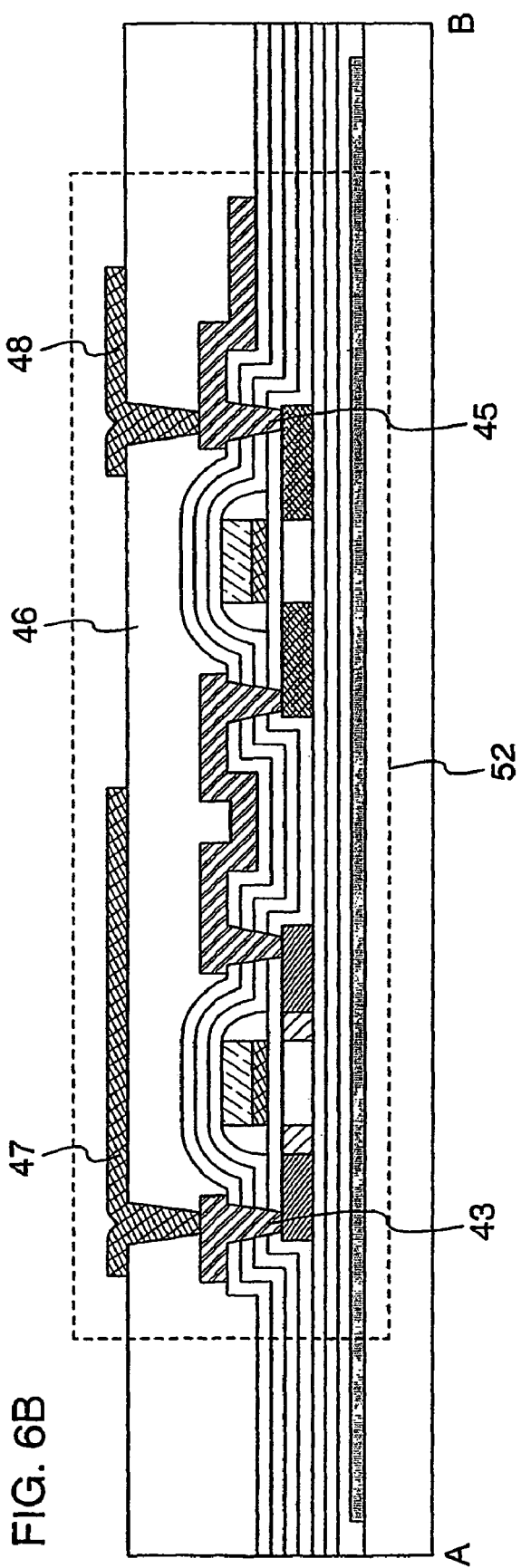
FIG. 6A
FIG. 6B

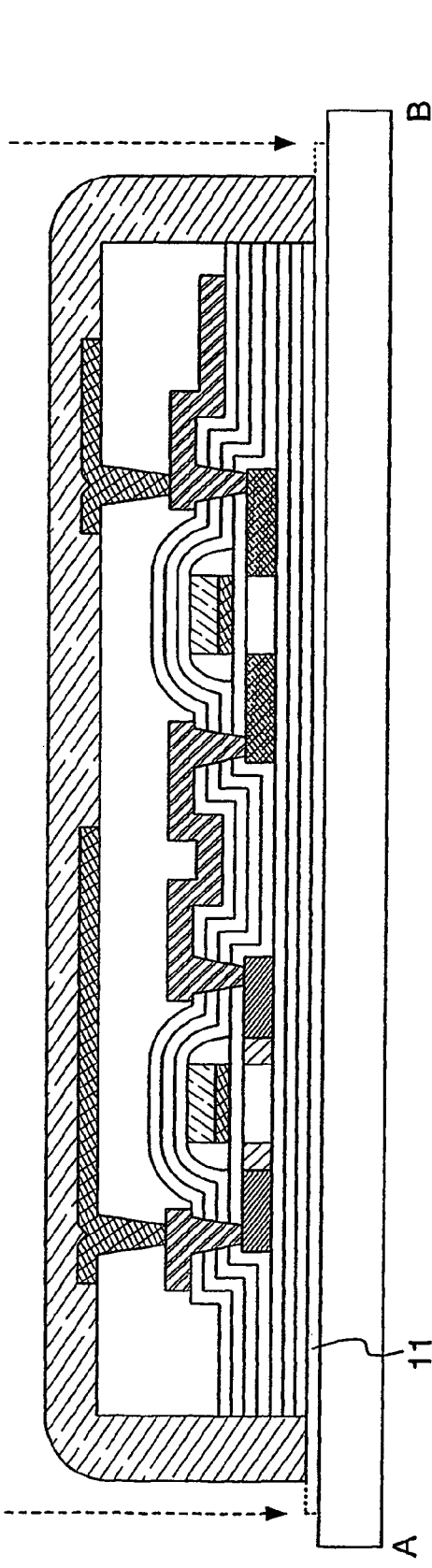
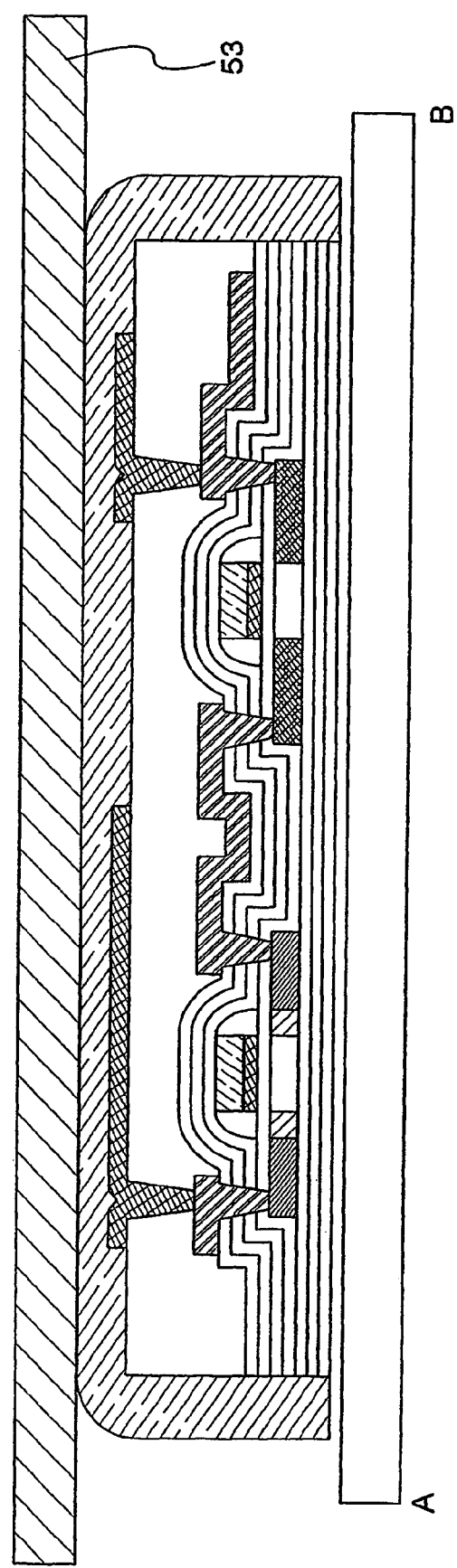

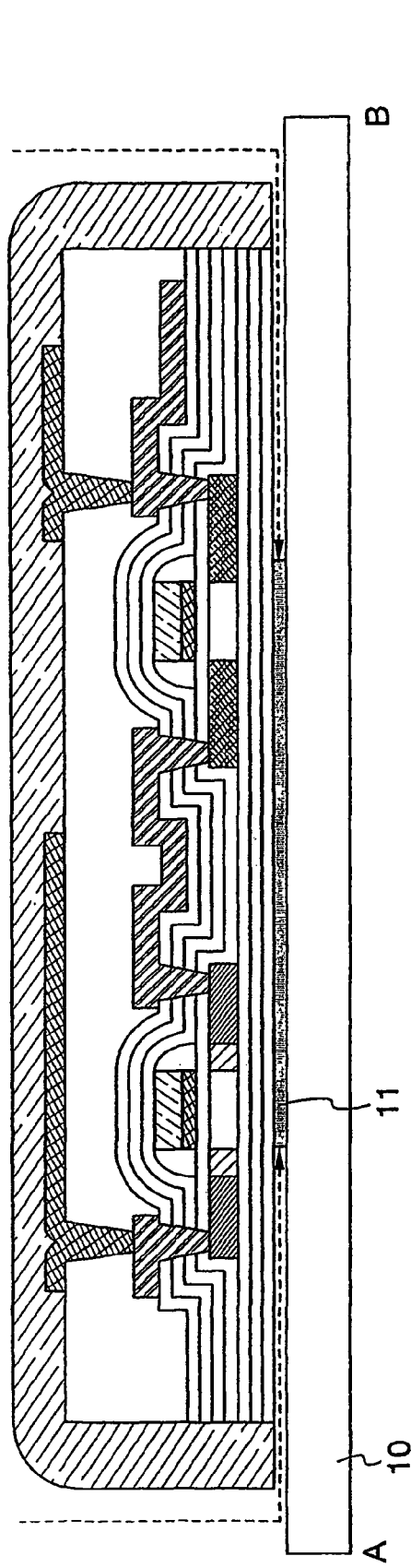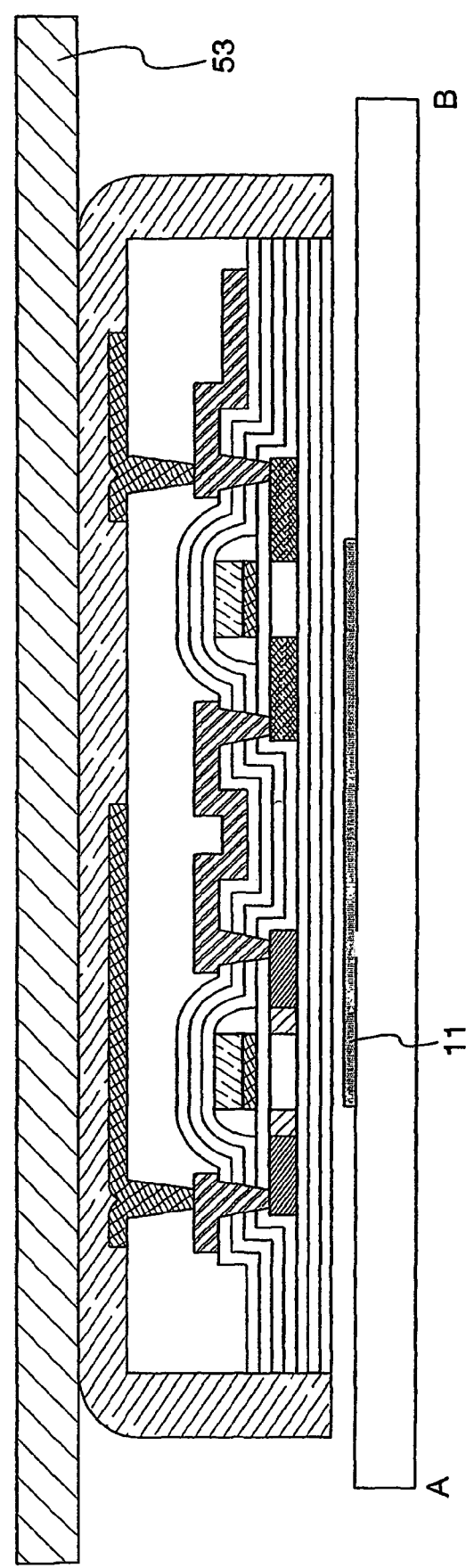

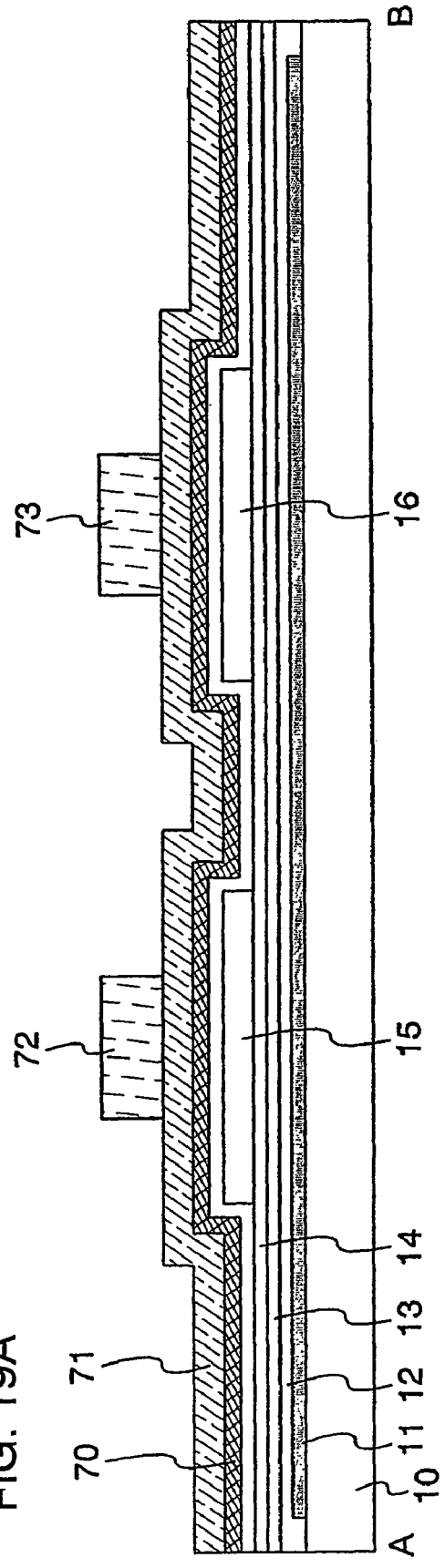
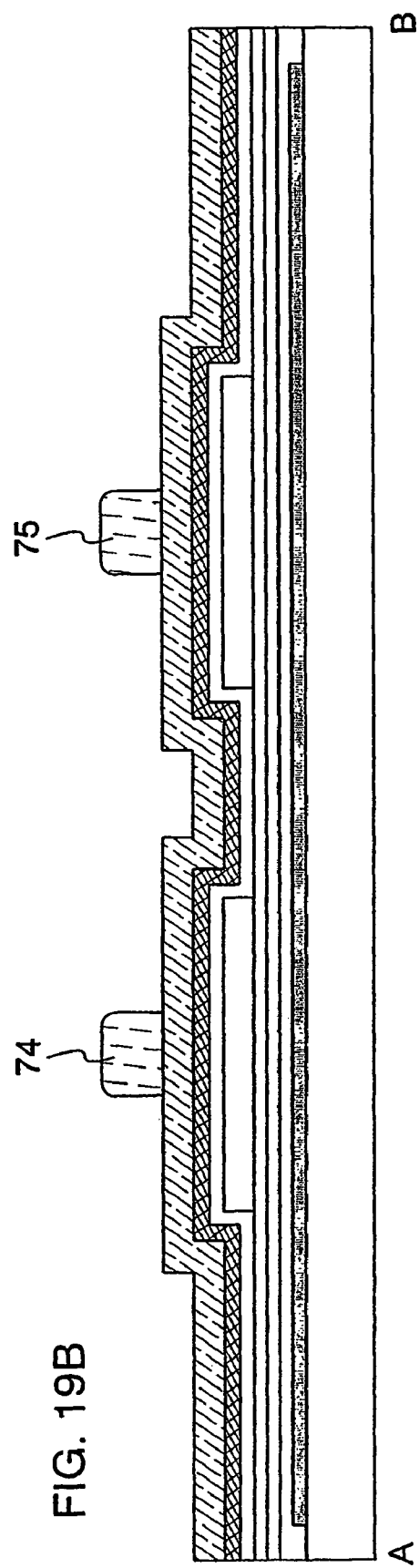

WIRELESS CHIP AND MANUFACTURING METHOD THEREOF

TECHNICAL FIELD

The present invention relates to a wireless chip and a manufacturing method thereof.

BACKGROUND ART

In recent years, a wireless chip that transmits and receives data by wireless has been developed actively. The wireless chip that transmits and receives data is referred to as an IC chip, an RF tag, a wireless tag, an electronic tag, a wireless processor, a wireless memory, RFID (Radio Frequency IDentification), an RF chip, an IC tag, an IC label, an electronic chip, or the like (for example, see Reference 1: Japanese Patent Laid-Open No. 2004-221570 (FIG. 13)). A wireless chip using a silicon substrate is mainly used among the wireless chips that are in practical use now.

DISCLOSURE OF INVENTION

Although a wireless chip has been tried to prevail at low cost, it is difficult to reduce the cost of a wireless chip because a silicon substrate is expensive. In addition, a commercial silicon substrate is circular, diameter of which is approximately 30 cm at most. Therefore, the mass production is difficult; thus, it is difficult to reduce the cost of a wireless chip.

Moreover, it is expected to use a wireless chip actively in various fields and a wireless chip is used by attaching to and mounting on various articles. Therefore, a wireless chip is required to be downsized and lightweight. In addition, since some articles to which a wireless chip is attached is flexible, it is required that a wireless chip can be processed into a flexible shape easily.

In view of the above situation, it is an object of the present invention to reduce the cost of a wireless chip, further, to reduce the cost of a wireless chip by enabling the mass production of a wireless chip, and furthermore, to provide a downsized and lightweight wireless chip.

A wireless chip in which a thin film integrated circuit is formed between a first base material and a second base material is provided according to the invention. As compared with a wireless chip formed from a silicon substrate, the wireless chip according to the invention realizes downsizing, thinness, and lightweight. In addition, since the thin film integrated circuit is peeled from a substrate, the wireless chip can be processed into a flexible shape easily.

A thin film integrated circuit included in a wireless chip according to the invention at least has an n-type (n-channel type) thin film transistor having a single drain structure, a p-type (p-channel type) thin film transistor having a single drain structure, and a conductive layer that functions as an antenna.

The structure of a thin film integrated circuit included in a wireless chip according to the invention is described in detail. According to one feature of the invention, a thin film integrated circuit comprises a first thin film transistor and a second thin film transistor provided over a first insulating layer; a second insulating layer covering the first thin film transistor and the second thin film transistor; a first conductive layer being in contact with the second insulating layer and functioning as a source or drain wiring; a third insulating layer covering the first conductive layer; a second conductive layer being in contact with the third insulating layer and functioning as an antenna; and a fourth insulating layer covering the second conductive layer, wherein a first semiconductor layer included in the first thin film transistor has a channel forming region and an n-type impurity region, and wherein a second semiconductor layer included in the second thin film transistor has a channel forming region and a p-type impurity region.

In addition, the thin film integrated circuit included in the wireless chip according to the invention at least has an n-type thin film transistor having an LDD (Lightly Doped Drain) structure, a p-type thin film transistor having a single drain structure, and a conductive layer functioning as an antenna. Since the power supply of a wireless chip is supplied from an antenna, it is difficult to stabilize the power supply and it is necessary to control the power consumption as much as possible. If the power consumption increases, this causes disadvantage that, for example, the power consumption of a reader/writer is increased, there is adverse effect on another device or a human body, or a communication distance between a wireless chip and a reader/writer is restricted because it is necessary to input an intense electromagnetic wave. However, since the wireless chip according to the invention has the n-type thin film transistor having an LDD structure, the leakage current can be reduced, which realizes low power consumption. Therefore, even when a complicated process such as cipher processing is performed, stabilization of the power supply is realized without destabilization of the power supply. Further, there is no necessity to input an intense electromagnetic wave; thus, the communication distance with a reader/writer can be improved.

The structure of a thin film integrated circuit included in a wireless chip according to the invention is described in detail. According to another feature of the invention, a thin film integrated circuit comprises a first thin film transistor and a second thin film transistor provided over a first insulating layer; a second insulating layer covering the first thin film transistor and the second thin film transistor; a first conductive layer being in contact with the second insulating layer and functioning as a source or drain wiring; a third insulating layer covering the first conductive layer; a second conductive layer being in contact with the third insulating layer and functioning as an antenna; and a fourth insulating layer covering the second conductive layer. The first thin film transistor has a sidewall insulating layer being in contact with the side surface of a gate electrode layer and overlapped with a first n-type impurity region, and has a channel forming region, the first n-type impurity region, and a second n-type impurity region. The concentration of an impurity element in the first n-type impurity region is lower than the concentration of an impurity element in the second n-type impurity region. The second thin film transistor has a channel forming region and a p-type impurity region.

In the thin film integrated circuit having the above structure, each channel length of the semiconductor layers included in the first thin film transistor and the second thin film transistor is 1 μm to 3 μm. In addition, the gate electrode layers included in the first thin film transistor and the second thin film transistor each has a tantalum nitride layer and a tungsten layer over the tantalum nitride layer.

The first conductive layer has a first titanium layer, an aluminum silicon layer over the first titanium layer, and a second titanium layer over the aluminum silicon layer. In addition, the first conductive layer has a titanium nitride layer, a first titanium layer over the titanium nitride layer, an aluminum layer over the first titanium layer, and a second titanium layer over the aluminum layer.

The second conductive layer has an aluminum layer. In addition, the second conductive layer has a titanium layer and an aluminum layer over the titanium layer.

The first insulating layer has a silicon oxide layer, a silicon nitride oxide layer over the silicon oxide layer, and a silicon oxynitride layer over the silicon nitride oxide layer. In addition, the first insulating layer has a first silicon oxynitride layer, a silicon nitride oxide layer over the first silicon oxynitride layer, and a second silicon oxynitride layer over the silicon nitride oxide layer. Moreover, the first insulating layer has a silicon nitride oxide layer and silicon oxynitride layer over the silicon nitride oxide layer.

The second insulating layer has a single layer or stacked layers of an inorganic layer. In addition, the third insulating layer has an organic layer and an inorganic insulating layer over the organic layer. Moreover, the third insulating layer has a single layer or stacked layers of an inorganic layer. Further, the fourth insulating layer has an organic layer. Furthermore, one or both of the first base material and the second base material have an adhesive layer on one surface.

According to a method for manufacturing a wireless chip according to the invention, a plurality of wireless chips is formed by forming a peeling layer over a substrate, forming a plurality of thin film integrated circuits over the peeling layer, then removing the peeling layer, and subsequently, sealing the thin film integrated circuits by base materials. Since a large amount of wireless chips can be formed at a time according to the manufacturing method of the invention, the cost of a wireless chip can be reduced. In addition, a substrate (for example, a glass substrate) whose side is not limited in size is used instead of a silicon substrate; therefore, the productivity of a wireless chip can be improved remarkably. As compared with the case of taking out wireless chip of a circular silicon substrate, such an advantage predominates considerably.

According to another feature of the invention, a method for manufacturing a wireless chip comprises the steps of: forming a peeling layer over a substrate; forming a first insulating layer over the peeling layer; forming an amorphous semiconductor layer over the first insulating layer; forming a crystalline semiconductor layer by crystallizing the amorphous semiconductor layer, forming a gate insulating layer over the crystalline semiconductor layer; forming a first conductive layer functioning as a gate electrode over the gate insulating layer; forming a first n-type impurity region and a p-type impurity region by adding an impurity element into the crystalline semiconductor layer, using the first conductive layer as a mask; forming a sidewall insulating layer being in contact with the side surface of the first conductive layer and overlapped with the part of the first n-type impurity region; forming a second n-type impurity region and a third n-type impurity region by adding an impurity element into the first n-type impurity region, using the sidewall insulating layer as a mask; forming a second insulating layer over the first conductive layer; forming a second conductive layer being in contact with the second insulating layer and functioning as a source or drain wiring; forming a third insulating layer to cover the second conductive layer; and forming a third conductive layer being in contact with the third insulating layer and functioning as an antenna.

After the above steps, there are the following four steps. One is the steps of forming an opening by etching the first insulating layer, the gate insulating layer, the second insulating layer, and the third insulating layer to expose the peeling layer; forming a fourth insulating layer to cover the third conductive layer; and peeling a thin film integrated circuit having a thin film transistor at least including the crystalline semiconductor layer, the gate insulating layer, and the first conductive layer from the substrate by introducing etchant to the opening and removing the peeling layer.

Another is the steps of forming a fourth insulating layer to cover the third conductive layer; forming an opening by etching the first insulating layer, the gate insulating layer, the second insulating layer, the third insulating layer, and the fourth insulating layer to expose the peeling layer; and peeling a thin film integrated circuit having a thin film transistor at least including the crystalline semiconductor layer, the gate insulating layer, and the first conductive layer from the substrate by introducing etchant to the opening and removing the peeling layer.

Another is the steps of forming an opening by etching the first insulating layer, the gate insulating layer, the second insulating layer, and the third insulating layer to expose the peeling layer; forming a fourth insulating layer to cover the third conductive layer; removing the peeling layer selectively by introducing etchant to the opening; and peeling a thin film integrated circuit having a thin film transistor at least including the crystalline semiconductor layer, the gate insulating layer, and the first conductive layer from the substrate by a physical means (physical force).

The other is the steps of forming a fourth insulating layer to cover the third conductive layer, forming an opening by etching the first insulating layer, the gate insulating layer, the second insulating layer, the third insulating layer, and the fourth insulating layer to expose the peeling layer; removing the peeling layer selectively by introducing etchant to the opening; and peeling a thin film integrated circuit having a thin film transistor at least including the crystalline semiconductor layer, the gate insulating layer, and the first conductive layer from the substrate by a physical means (physical force).

According to the other feature of the invention, the substrate is a glass substrate in a method for manufacturing a wireless chip according to the invention having the above steps. Alternatively, the substrate is a quartz substrate. In addition, a layer containing tungsten or molybdenum is formed in an oxygen atmosphere by a sputtering method as the peeling layer. A layer containing the oxide of tungsten ($WO_x$; the value x satisfies $0<x<3$) is formed in an oxygen atmosphere by a sputtering method as the peeling layer. Moreover, a layer containing silicon is formed as the peeling layer. A layer containing tungsten or molybdenum is formed as the peeling layer. Further, a layer containing tungsten or molybdenum is formed and a layer containing the oxide of silicon is formed thereover as the peeling layer. Furthermore, the etchant is gas or liquid containing halogen fluoride.

According to the invention in which a thin film integrated circuit is formed with the use of a substrate besides a silicon substrate, since a large amount of wireless chips can be formed at a time, the cost of a wireless chip can be reduced. In addition, since a thin film integrated circuit that is peeled from a substrate is used, a downsized, thin, and lightweight wireless chip can be provided. Further, a wireless chip easily processed into a flexible shape can be provided.

BRIEF DESCRIPTION OF DRAWINGS

In the accompanying drawings:

FIGS. 2A and 2B are views each explaining a wireless chip according to the present invention and a manufacturing method thereof;

FIGS. 5A and 5B are views each explaining a wireless chip according to the present invention and a manufacturing method thereof;

FIGS. 6A and 6B are views each explaining a wireless chip according to the present invention and a manufacturing method thereof;

FIGS. 10A and 10B are views each explaining a wireless chip according to the present invention and a manufacturing method thereof;

FIGS. 18A and 18B are views each explaining a wireless chip according to the present invention and a manufacturing method thereof;

FIGS. 19A and 19B are views each explaining a wireless chip according to the present invention and a manufacturing method thereof;

BEST MODE FOR CARRYING OUT THE INVENTION

Figure 1:
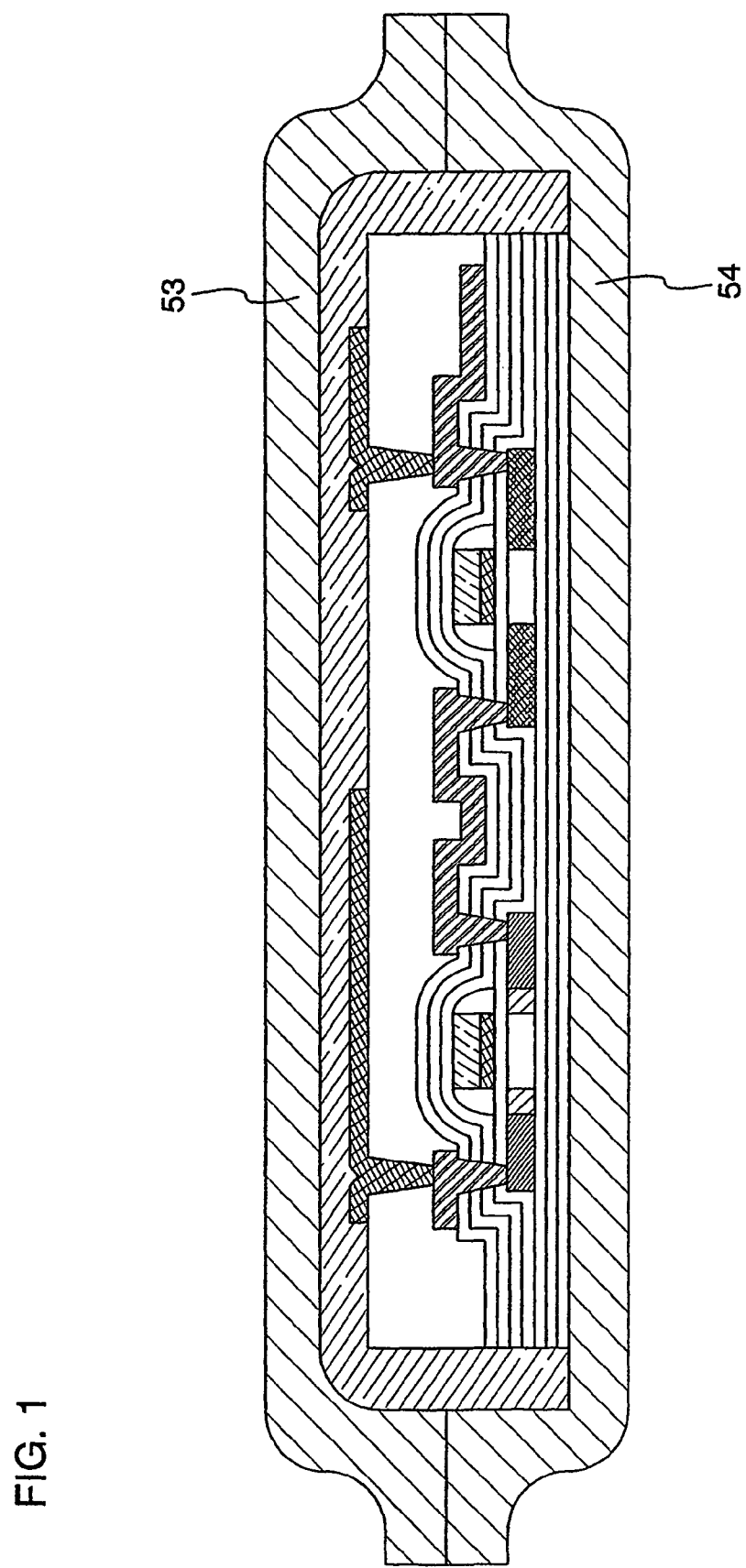
FIG. 1 is a view explaining a wireless chip according to the present invention and a manufacturing method thereof.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be construed as being included therein. It is to be noted that the same portion is denoted by the same reference numeral in different drawings in a structure of the invention described hereinafter.

Embodiment Mode

A method for manufacturing a wireless chip according to the invention will be explained with reference to the drawings.

Figure 3:
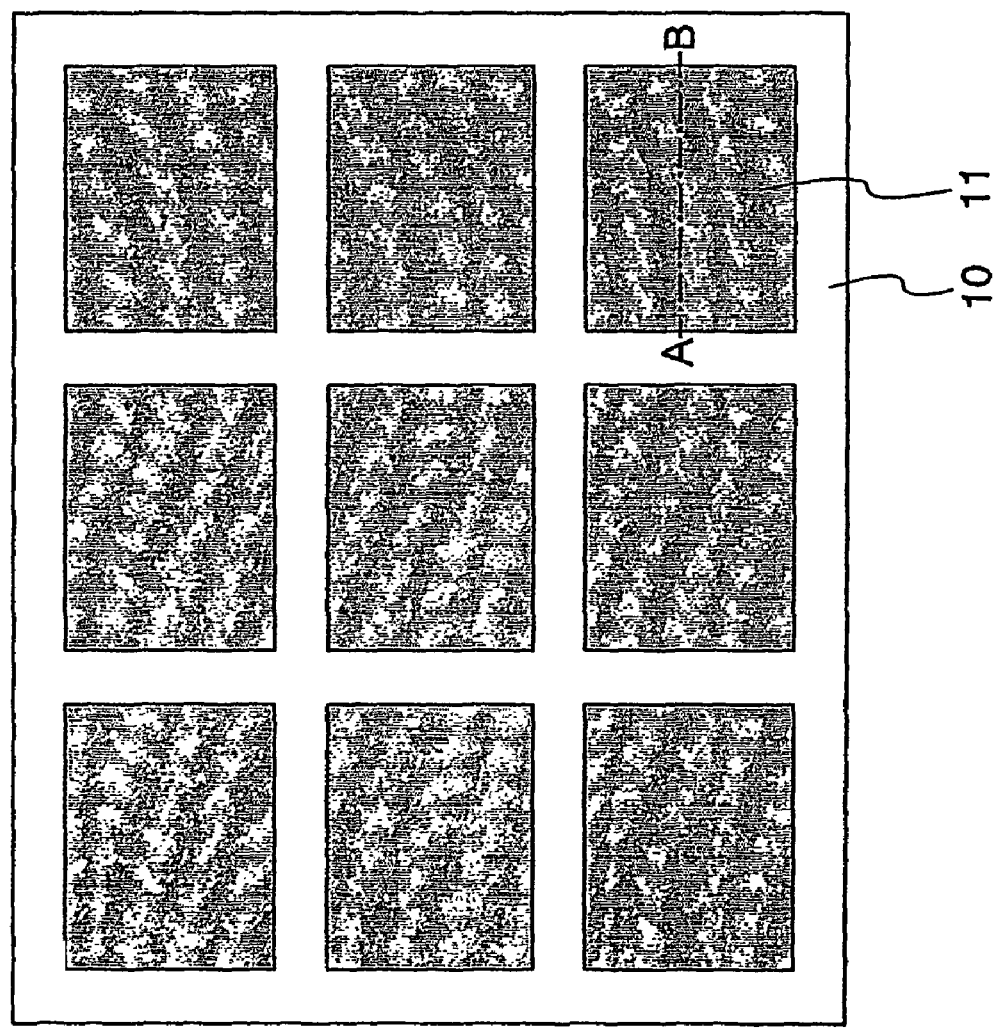
FIG. 3 is a view explaining a wireless chip according to the present invention and a manufacturing method thereof.

First, a peeling layer 11 is formed over one surface of a substrate 10 (see a cross-sectional view in FIG. 2A and a top view in FIG. 3). A glass substrate, quartz substrate, metal substrate or stainless substrate where an insulating layer is formed on one surface; a heat-resistant plastic substrate withstanding a processing temperature of this process; or the like is used for the substrate 10. If such a substrate is used for the substrate 10, the size and shape are not limited considerably; therefore, the productivity of a wireless chip can be improved completely as long as a rectangular substrate whose side is 1 m or more is used, for example. As compared with the case of taking out wireless chips of a circular silicon substrate, such an advantage predominates considerably. In addition, a thin film integrated circuit formed over the substrate 10 is peeled from the substrate 10 subsequently. Specifically, a wireless chip provided according to the invention does not have the substrate 10. Therefore, the substrate 10 from which the thin film integrated circuit is peeled can be reused over any number of times. Accordingly, the cost of the wireless chip can be reduced if the substrate 10 is reused. A quartz substrate is desirable as the substrate 10 that is reused.

Note that, in this embodiment mode, a thin film is formed over one surface of the substrate 10 and then patterned by a photolithography method to provide the peeling layer 11 selectively; however, this process is not essential in the invention. If not necessary, it is not necessary to provide the peeling layer selectively and may be provided over the entire surface.

The peeling layer 11 is formed by a known means (a sputtering method, a plasma CVD method, or the like) in a single layer or stacked layers of a layer formed from an element of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material containing the element as the main component. The crystalline structure of a layer containing silicon may be any one of an amorphous state, a microcrystalline state, or a polycrystalline state.

When the peeling layer 11 has a single layer structure, it is preferable to form a tungsten layer, a molybdenum layer, or a layer containing mixture of tungsten and molybdenum. Alternatively, a layer containing the oxide or oxynitride of tungsten, a layer containing the oxide or oxynitride of molybdenum, or a layer containing the oxide or oxynitride of mixture of tungsten and molybdenum is formed. Note that the mixture of tungsten and molybdenum corresponds to an alloy of tungsten and molybdenum, for example. In addition, the oxide of tungsten is also referred to as tungsten oxide.

When the peeling layer 11 has a stacked layer structure, it is preferable to form a tungsten layer, a molybdenum layer, or a layer containing mixture of tungsten and molybdenum as the first layer and to form the oxide, nitride, oxynitride, or nitride oxide of tungsten, molybdenum, or mixture of tungsten and molybdenum as the second layer.

When the peeling layer 11 is formed to have a stacked layer structure of a layer containing tungsten and a layer containing the oxide of tungsten, it may be utilized that a layer containing the oxide of tungsten is formed in an interface between a tungsten layer and a silicon oxide layer by forming a layer containing tungsten and a layer containing silicon oxide thereover. This is the same in the case of forming a layer containing the nitride, oxynitride, and nitride oxide of tungsten. A layer containing tungsten is formed and then a silicon nitride layer, a silicon oxynitride layer, or a silicon nitride oxide layer is formed thereover. Note that a layer containing tungsten is formed and then a silicon oxide layer, a silicon oxynitride layer, a silicon nitride oxide layer, or the like that is formed thereover functions as an insulating layer to be a base subsequently.

When the peeling layer 11 is formed to have a stacked layer structure of a layer containing tungsten and a layer containing the oxide of tungsten, first, a layer containing tungsten may be formed by a sputtering method and then a layer containing tungsten oxide may be formed by a sputtering method. Alternatively, first, a layer containing tungsten may be formed by a sputtering method and then a tungsten oxide layer may be formed by oxidizing part of the tungsten layer.

The oxide of tungsten is represented by $WO_x$, in which x ranges from 2 to 3 (preferably $2 \leq x < 3$). There are cases where x is 2 ($WO_2$), 2.5 ($W_2O_5$), 2.75 ($W_4O_{11}$), 3 ($WO_3$), or the like. In forming the oxide of tungsten, the above x values are not limited particularly and it is desirable to decide the value depending on the etching rate.

However, it is a layer containing the oxide of tungsten ($WO_x$; $0 < x < 3$) which is formed by a sputtering method in an oxygen atmosphere that has the most desirable etching rate. Therefore, in order to shorten the manufacturing time, it is preferable to form a layer containing the oxide of tungsten in an oxygen atmosphere by a sputtering method as the peeling layer.

Although the peeling layer 11 is formed so as to be in contact with the substrate 10 according to the above process, the invention is not limited to this process. An insulating layer to be a base may be formed so as to be in contact with the substrate 10, and the peeling layer 11 may be formed so as to be in contact with the insulating layer.

Then, an insulating layer to be a base is formed so as to cover the peeling layer 11. The insulating layer to be a base is formed in a single layer or stacked layers of a layer containing the oxide of silicon or the nitride of silicon by a known means (a sputtering method, a plasma CVD method, or the like). The oxide material of silicon is a material containing silicon (Si) and oxygen (O), which corresponds to silicon oxide, silicon oxynitride, silicon nitride oxide, or the like. The nitride material of silicon is a material containing silicon and nitride (N), which corresponds to silicon nitride, silicon oxynitride, silicon nitride oxide, or the like.

When the insulating layer to be a base has a two-layer structure, for example, it is desirable to form a silicon nitride oxide layer as the first layer and a silicon oxynitride layer as the second layer. When the insulating layer to be a base has a three-layer structure, it is desirable to form a silicon oxide layer as an insulating layer 12 of the first layer, a silicon nitride oxide layer as an insulating layer 13 of the second layer, and a silicon oxynitride layer as an insulating layer 14 of the third layer. Alternatively, it is desirable to form a silicon oxynitride layer as the insulating layer 12, a silicon nitride oxide layer as the insulating layer 13, and a silicon oxynitride layer as the insulating layer 14. The cross-sectional structure shown in FIG. 2A is the case where the insulating layer to be a base has a three-layer structure. The insulating layer to be a base functions as a blocking film that prevents the entry of impurities from the substrate 10.

Then, an amorphous semiconductor layer (for example, a layer containing amorphous silicon) is formed over the insulating layer 14 to be a base. The amorphous semiconductor layer is formed in a thickness of 25 nm to 200 nm (preferably, 30 nm to 150 nm) by a known means (a sputtering method, an LPCVD method, a plasma CVD method, or the like). Subsequently, the amorphous semiconductor layer is crystallized by a known crystallization method (a laser crystallization method, an RTA method, a thermal crystallization method using an annealing furnace, a thermal crystallization method using a metal element promoting crystallization, a method in which the thermal crystallization method using a metal element promoting crystallization and the laser crystallization method are combined, or the like) to form a crystalline semiconductor layer. Thereafter, the obtained crystalline semiconductor layer is patterned into a desired shape to form crystalline semiconductor layers 15 and 16.

A specific example of the manufacturing process of the crystalline semiconductor layers 15 and 16 is as follows. First, an amorphous semiconductor layer in 66 nm thick is formed by using a plasma CVD method. Then, after a solution containing nickel that is a metal element promoting crystallization is kept over the amorphous semiconductor layer, dehydrogenation treatment (at 500° C. for one hour) and thermal crystallization treatment (at 550° C. for 4 hours) are performed to the amorphous semiconductor layer to form a crystalline semiconductor layer. Thereafter, the crystalline semiconductor layers 15 and 16 are formed by performing laser light irradiation, if necessary, and performing patterning treatment using a photolithography method.

Note that a continuous-oscillation or pulsed-oscillation gas laser or solid laser is used in the case of forming the crystalline semiconductor layers by a laser crystallization method. The following laser can be used as the gas laser: an excimer laser, a YAG laser, a $YVO_4$ laser, a YLF laser, $YAlO_3$ laser, a glass laser, a ruby laser, a Ti: sapphire laser, or the like. On the other hand, a laser using a crystal such as YAG, $YVO_4$, YLF, or $YAlO_3$ in which Cr, Nd, Er, Ho, Ce, Co, Ti, or Tm is doped is used as the solid laser.

In addition, when the amorphous semiconductor layer is crystallized by using a metal element promoting crystallization, it is advantageous that the crystal grows in the same direction in addition to that crystallization is possible at a low temperature within a short time, whereas it is disadvantageous that the OFF current is increased because the metal element remains in the crystalline semiconductor layers and thus the characteristic is not stabilized. Accordingly, it is desirable to form an amorphous semiconductor layer that functions as a gettering site over the crystalline semiconductor layers. Since it is necessary to make the amorphous semiconductor layer that functions as a gettering site contain an impurity element of phosphorus or argon, preferably, it is desirable to form the amorphous semiconductor layer by a sputtering method capable of having the amorphous semiconductor layer contain argon in high concentration. Thereafter, the metal element is diffused in the amorphous semiconductor layer by performing heat treatment (an RTA method, thermal annealing using an annealing furnace) and the amorphous semiconductor layer containing the metal element is removed subsequently. Accordingly, the content of the metal element in the crystalline semiconductor layers can be reduced or the metal element can be removed.

Then, a gate insulating layer 17 covering the crystalline semiconductor layers 15 and 16 is formed (see FIG. 2B). The gate insulating layer 17 is formed in a single layer or stacked layers of a layer containing the oxide of silicon or the nitride of silicon by a known means (a plasma CVD method or a sputtering method). Specifically, the gate insulating layer 17 is formed in a single layer or stacked layers of a layer containing silicon oxide, a layer containing silicon oxynitride, or a layer containing silicon nitride oxide.

Next, a first conductive layer and a second conductive layer are stacked over the gate insulating layer 17. The first conductive layer is formed in a thickness of 20 nm to 100 nm by a known means (a plasma CVD method or a sputtering method). The second conductive layer is formed in a thickness of 100 nm to 400 nm by a known means.

The first conductive layer and the second conductive layer are formed from an element of tantalum (Ta), tungsten (W), titanium (Ti), molybdenum (Mo), aluminum (Al), copper (Cu), chromium (Cr), niobium (Nd), and the like or an alloy material or a compound material containing the element as the main component. Alternatively, the first conductive layer and the second conductive layer are formed from a semiconductor material typified by polycrystalline silicon in which an impurity element such as phosphorus or the like is doped. A combination example of the first conductive layer and the second conductive layer is as follows. A tantalum nitride (TaN; the composition ratio of tantalum (Ta) and nitrogen (N) is not limited) layer and a tungsten (W) layer, a tungsten nitride (WN; the composition ratio of tungsten (W) and nitrogen (N) is not limited) layer and a tungsten layer, a molybdenum nitride (MoN; the composition ratio of molybdenum (Mo) and nitrogen (N) is not limited) layer and a molybdenum (Mo) layer, or the like. Since tungsten or tantalum nitride has high heat resistance, heat treatment aimed at thermal activation can be performed after forming the first conductive layer and the second conductive layer. In addition, in the case of a three-layer structure instead of the two-layer structure, it is desirable to employ a structure of a molybdenum layer, an aluminum layer, and a molybdenum layer.

Then, resist masks are formed by using a photolithography method and etching treatment for forming a gate electrode and a gate line is performed to form conductive layers (also referred to as a gate electrode layer) 18 to 21 each functioning as a gate electrode.

Next, the resist masks for forming the conductive layers 18 to 21 are removed and a resist mask 22 is newly formed by a photolithography method. Subsequently, n-type impurity regions 23 and 24 are formed by adding an impurity element imparting n-type conductivity into the crystalline semiconductor layer 15 by an ion dope method or an ion implantation method to form a low concentration region. It is sufficient that an element belonging to Group 15 is used for the impurity element imparting n-type conductivity and, for example, phosphorus (P) or arsenic (As) is used.

Figure 4A:
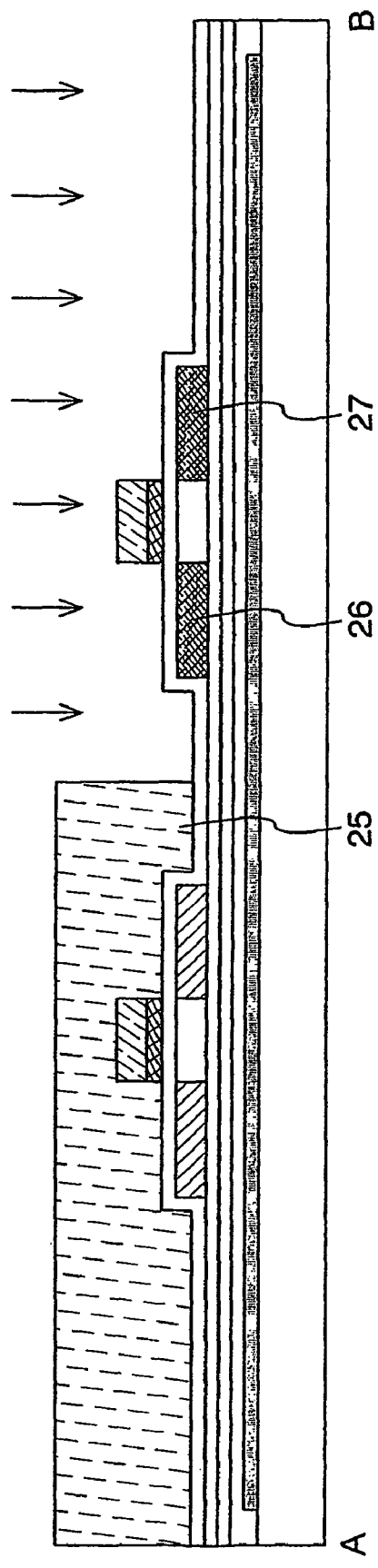
FIGS. 4A and 4B are views each explaining a wireless chip according to the present invention and a manufacturing method thereof.

Subsequently, the resist mask 22 is removed and a resist mask 25 is newly formed by a photolithography method (see FIG. 4A). Subsequently, p-type impurity regions 26 and 27 are formed by adding an impurity element imparting p-type conductivity into the crystalline semiconductor layer 16. For example, boron (B) is used for the impurity element imparting p-type conductivity.

Figure 4B:
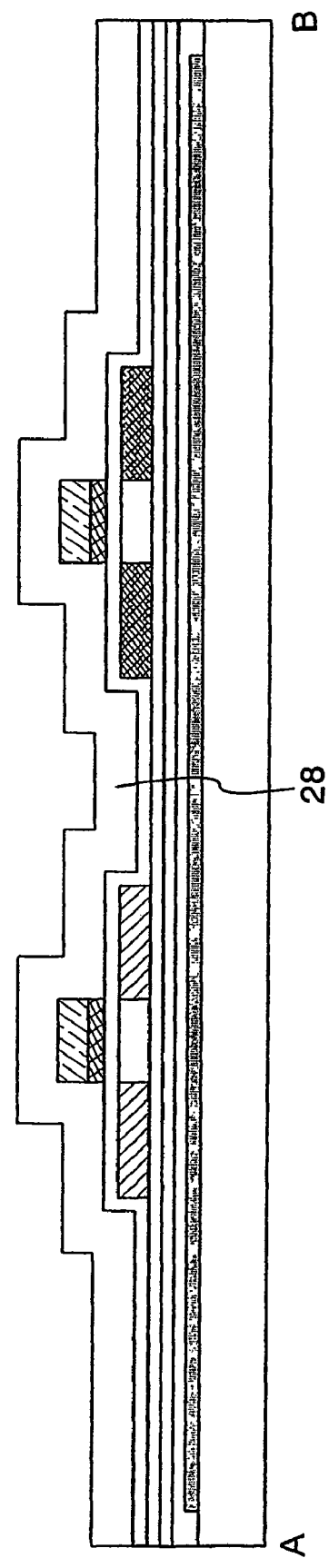

Then, the resist mask 25 is removed and an insulating layer 28 is formed so as to cover the gate insulating layer 17 and the conductive layers 18 to 21 (see FIG. 4B). The insulating layer 28 is formed by a known means (a plasma CVD method or a sputtering method) in a single layer or stacked layers of a layer containing an inorganic material such as silicon, the oxide of silicon, or the nitride of silicon (also referred to as an inorganic layer) or a layer containing an organic material such as organic resin (also referred to as an organic layer).

Next, insulating layers (hereinafter referred to as a sidewall insulating layer) 29 and 30 in contact with the side surfaces of the conductive layers 18 to 21 are formed by etching the insulating layer 28 selectively by anisotropic etching which is mainly for the vertical direction (see FIG. 5A). The sidewall insulating layers 29 and 30 are used as masks for doping to form an LDD region subsequently.

Then, a resist mask 31 is formed by a photolithography method. Subsequently, first n-type impurity regions (also referred to as an LDD region) 34 and 35 and second n-type impurity regions 32 and 33 are formed by adding an impurity element imparting n-type conductivity into the crystalline semiconductor layer 15 by using the sidewall insulating layer 29 as a mask (see FIG. 5B). The concentration of the impurity element contained in the first n-type impurity regions 34 and 35 is lower than the concentration of the impurity element contained in the second n-type impurity regions 32 and 33.

Note that, there are two methods in order to form the LDD region. In one method, a gate electrode has a stacked layer structure of two layers or more, where taper etching or anisotropic etching is performed to the gate electrode and a conductive layer of the lower layer that forms the gate electrode is used as a mask. A sidewall insulating layer is used as a mask in the other method. A thin film transistor that is formed by employing the former method is referred to as a GOLD (Gate Overlapped Lightly Doped drain) structure. However, since taper etching or anisotropic etching is performed in this GOLD structure, it is difficult to control the width of the LDD region, and the LDD region cannot be formed if the etching process is not performed preferably. However, since the latter method in which a sidewall insulating layer is used as a mask is used in the invention, as compared with the former method, the width of the LDD regions is controlled easily and the LDD regions can be formed certainly.

Through the above processes, an n-type thin film transistor 36 and a p-type thin film transistor 37 are completed. The n-type thin film transistor 36 has an active layer including the first n-type impurity regions 34 and 35, the second n-type impurity regions 32 and 33, and a channel forming region 38; the gate insulating layer 17; and the conductive layers 18 and 19 that each function as a gate electrode. Such a structure of the thin film transistor 36 is referred to as an LDD structure.

The p-type thin film transistor 37 has an active layer including the p-type impurity regions 26 and 27 and a channel forming region 39; the gate insulating layer 17; and the conductive layers 20 and 21 that each function as a gate electrode. Such a structure of the thin film transistor 37 is referred to as a single drain structure.

In addition, each channel length of the thin film transistor 36 and the thin film transistor 37 that are completed through the above processes is 0.5 μm to 5 μm, preferably 1 μm to 3 μm. According to the above feature, the response speed can be improved. Note that the channel length can be set separately depending on the circuit. For example, it is desirable that the channel length of a thin film transistor included in a power supply circuit where high speed operation is not required is 3 μm, whereas the channel length of a thin film transistor in other circuits is 1 μm.

Then, the resist mask 31 is removed and an insulating layer is formed in a single layer or stacked layers so as to cover the thin film transistors 36 and 37 (see FIG. 6A). The insulating layer covering the thin film transistors 36 and 37 are formed by a known means (an SOG method, a droplet discharging method, or the like) in a single layer or stacked layers of an inorganic material such as the oxide of silicon or the nitride of silicon; an organic material such as polyimide, polyamide, benzocyclobutene, acrylic, or epoxy resin; or the like.

In addition, the insulating layer covering the thin film transistors 36 and 37 may be formed from siloxane by an SOG method or a droplet discharging method. Siloxane is composed of a skeleton structure formed by the bond of silicon (Si) and oxygen (O). It is desirable to use as the substituent an organic group at least containing hydrogen (such as an alkyl group or aromatic hydrocarbon), a fluoro group, or an organic group at least containing hydrogen and a fluoro group.

A cross-sectional structure shown in FIG. 6A is the case where the insulating layer covering the thin film transistors 36 and 37 has a three-layer structure. As its structure, it is desirable that, for example, a layer containing silicon oxide is formed as a first insulating layer 40, a layer containing silicon nitride is formed as a second insulating layer 41, and a layer containing silicon oxide is formed as a third insulating layer 42.

Note that it is desirable to perform heat treatment aimed at the recovery of the crystallinity of the semiconductor layer, the activation of the impurity element added into the semiconductor layer, or the hydrogenation of the semiconductor layer, before forming the insulating layers 40 to 42 or after forming one or a plurality of thin films among the insulating layers 40 to 42. It is desirable to apply a thermal annealing method, a laser annealing method, an RTA method, or the like to the heat treatment.

Then, contact holes for exposing the p-type impurity regions 26 and 27 and the n-type impurity regions 32 and 33 are formed by etching the insulating layers 40 to 42 by a photolithography method. Subsequently, conductive layers are formed so as to fill the contact holes and are pattern processed to form conductive layers 43 to 45 that each functions as a source or drain wiring.

The conductive layers 43 to 45 are formed by a known means (a plasma CVD method or a sputtering method) in a single layer or stacked layers of an element of titanium (Ti), aluminum (Al), and neodymium (Nd), or an alloy material or a compound material containing the element as the main component. An alloy material containing aluminum as the main component corresponds to an alloy material containing nickel whose main component is aluminum or an alloy material containing nickel and one or both of carbon and silicon whose main component is aluminum, for example. As for the conductive layers 43 to 45, for example, it is desirable to employ a stacked layer structure of a barrier layer, an aluminum silicon (Al—Si; aluminum (Al) in which silicon (Si) is added) layer, and a barrier layer or a stacked layer of a barrier layer, an aluminum silicon (Al—Si) layer, a titanium nitride (TiN; the composition ratio of titanium (Ti) and nitrogen (N) is not limited) layer, and a barrier layer. Note that a barrier layer corresponds to a thin film formed from titanium, the nitride of titanium, molybdenum, or the nitride of molybdenum. The aluminum or aluminum silicon has a low resistance value and is inexpensive, which is an optimum material for forming the conductive layers 43 to 45. In addition, generation of a hillock of aluminum or aluminum silicon can be prevented when upper and lower barrier layers are provided. Further, preferable contact can be obtained between aluminum or aluminum silicon and the crystalline semiconductor layers when a lower barrier layer is provided. Furthermore, regardless of a thin natural oxide film formed over the crystalline semiconductor layers, this natural oxide film can be reduced and preferable contact with the crystalline semiconductor layers can be obtained, when a barrier layer of titanium is formed because titanium is an element having a high reduction property.

Figure 7:
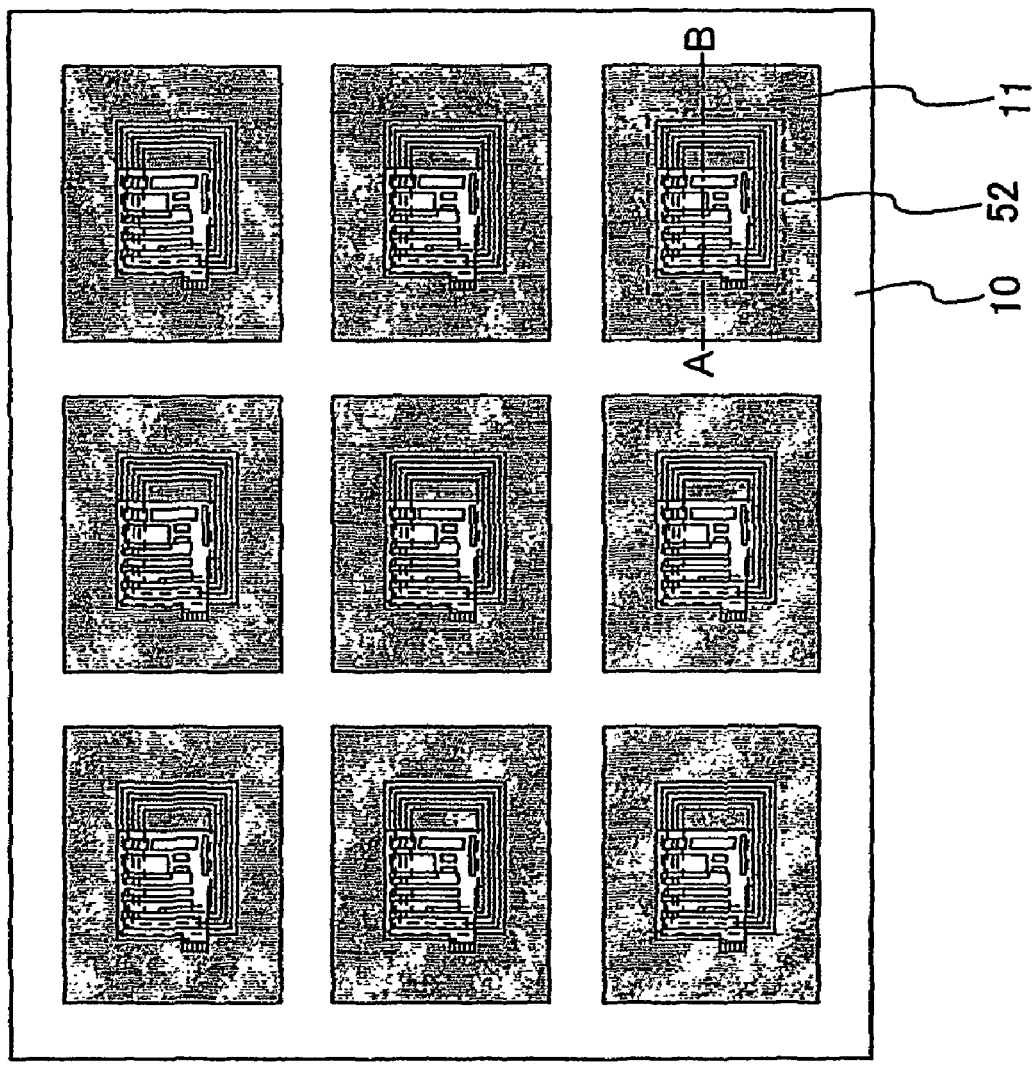
FIG. 7 is a view explaining a wireless chip according to the present invention and a manufacturing method thereof.

Next, an insulating layer 46 is formed so as to cover the conductive layers 43 to 45 (see a cross-sectional view in FIG. 6B and a top view in FIG. 7). The insulating layer 46 is formed in a single layer or stacked layers of an inorganic material or an organic material by a known means (an SOG method, a droplet discharging method, or the like). The insulating layer 46 is a thin film that is formed for relieving the unevenness of the thin film transistors to have planarity. Therefore, it is preferable to form the insulating layer 46 from an organic material.

Subsequently, contact holes for exposing the conductive layers 43 and 45 are formed by etching the insulating layer 46 by a photolithography method. Subsequently, conductive layers are formed so as to fill the contact holes and are pattern processed to form conductive layers 47 and 48 that each function as an antenna. The conductive layers 47 and 48 are formed in a single layer or stacked layers of an element of aluminum (Al), titanium (Ti), silver (Ag), and copper (Cu), or an alloy material or a compound material containing the elements as the main component. For example, it is desirable to employ a stacked layer structure of a barrier layer and an aluminum layer; a barrier layer, an aluminum layer, and a barrier layer; or the like. A barrier layer corresponds to titanium, the nitride of titanium, molybdenum, the nitride of molybdenum, or the like.

An element group including the thin film transistors 36, 37, and the like and the conductive layers 47 and 48 that each function as an antenna completed through the above processes are together referred to as a thin film integrated circuit 52. Although not shown in this process, a protective layer may be formed by a known means so as to cover the thin film integrated circuit 52. A protective layer corresponds to a layer containing carbon such as DLC (diamond-like carbon), a layer containing silicon nitride, a layer containing silicon nitride oxide, or the like.

Figure 8A:
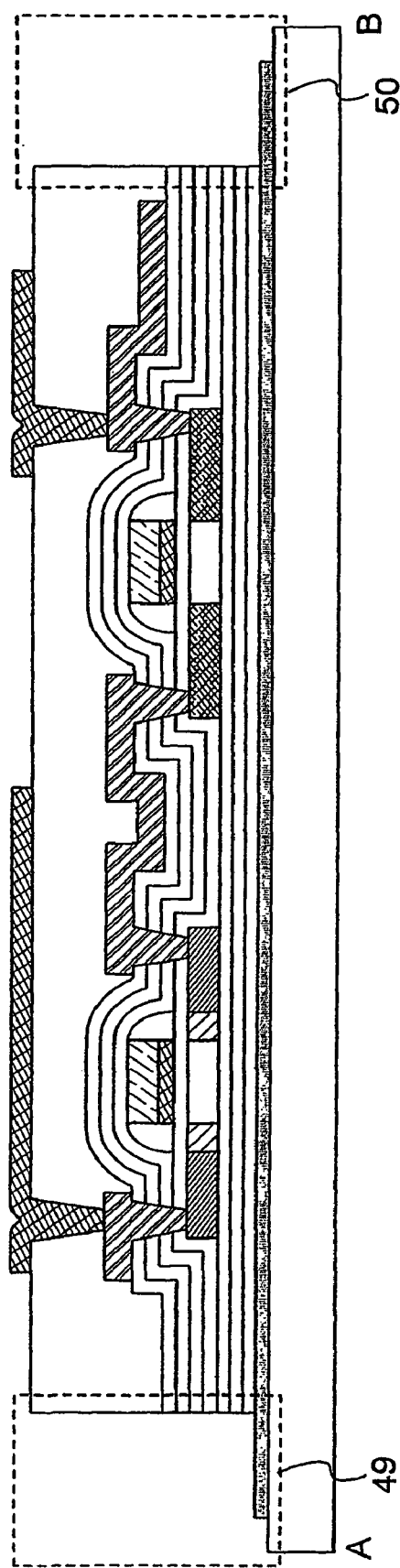
FIGS. 8A and 8B are views each explaining a wireless chip according to the present invention and a manufacturing method thereof.

Then, openings 49 and 50 are formed by etching the insulating layers 12 to 14, 17, 40 to 42, and 46 by a photolithography method so as to expose the peeling layer 11 (see FIG. 8A).

Figure 8B:
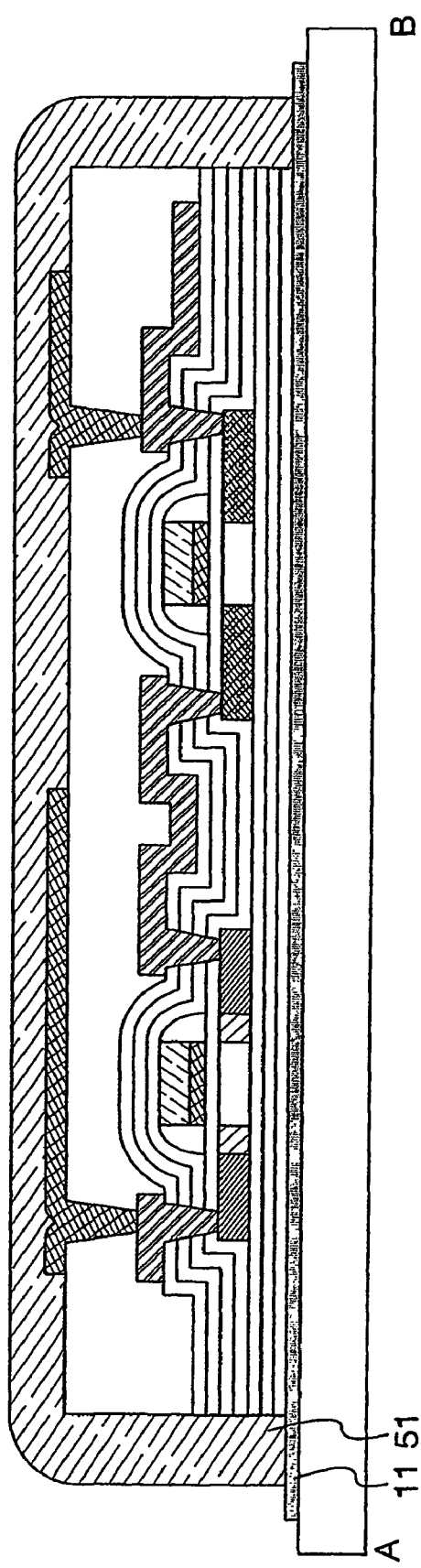
Figure 9:
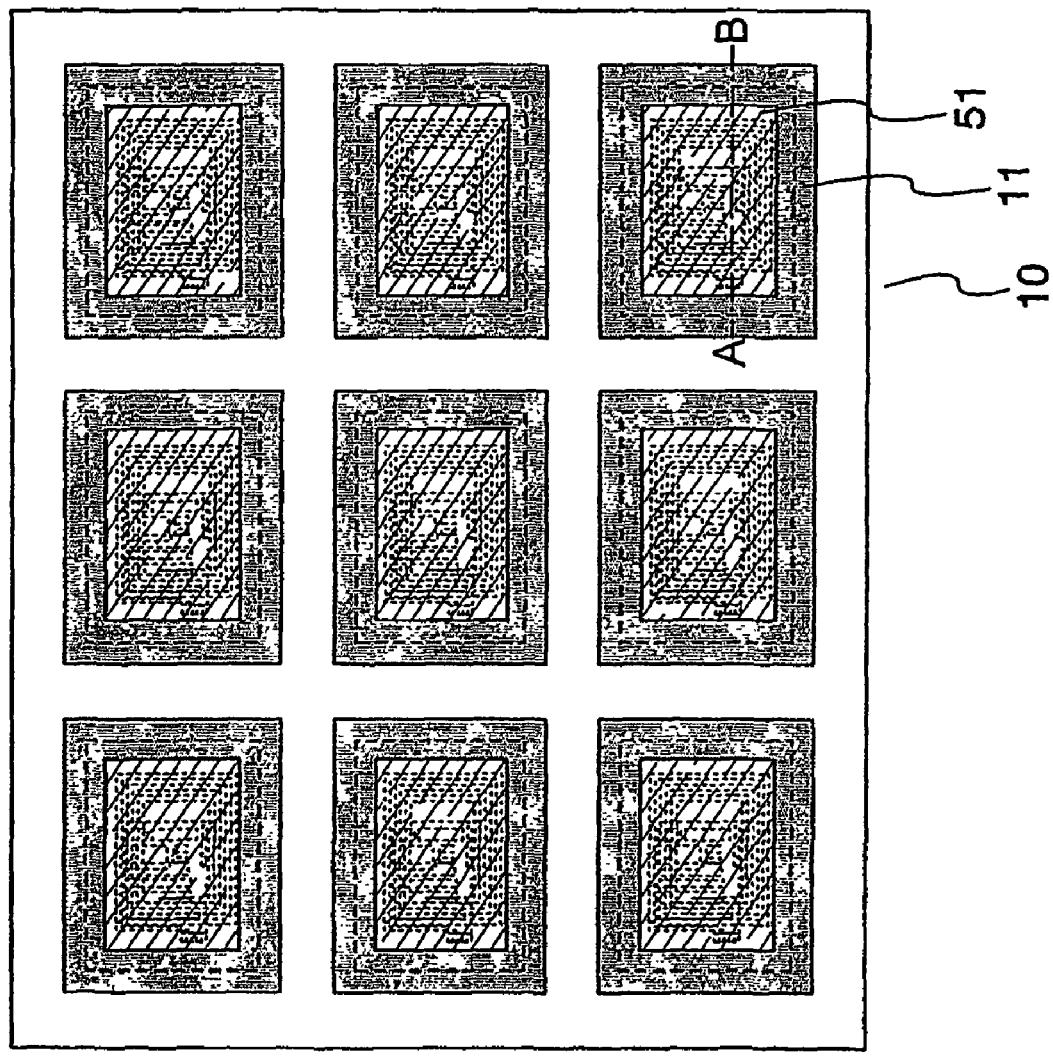
FIG. 9 is a view explaining a wireless chip according to the present invention and a manufacturing method thereof.

Next, an insulating layer 51 is formed by a known means (an SOG method, a droplet discharging method, or the like) so as to cover the thin film integrated circuit 52 (see a cross-sectional view in FIG. 8B and a top view in FIG. 9). The insulating layer 51 is formed from an organic material, preferably, from an epoxy resin. The insulating layer 51 is formed so that the thin film integrated circuit 52 is not scattered. In other words, since the thin film integrated circuit 52 is downsized, thin, and lightweight, the thin film integrated circuit 52, which is not closely in contact with the substrate, is likely to be scattered after removing the peeling layer. However, the thin film integrated circuit 52 increases the weight and thus scatter from the substrate 10 can be prevented by forming the insulating layer 51 in the periphery of the thin film integrated circuit 52. In addition, although thin and lightweight alone, the thin film integrated circuit 52 does not have a coiled shape by forming the insulating layer 51 and thus a certain degree of intensity can be ensured. Although the insulating layer 51 is formed in the upper surface and side surface of the thin film integrated circuit 52 in the structure shown in FIG. 8B, the invention is not limited to this structure and the insulating layer 51 may be formed only in the upper surface of the thin film integrated circuit 52. According to the above description, the process of forming the insulating layer 51 is performed after the process of forming the openings 49 and 50 by etching the insulating layers 12 to 14, 17, 40 to 42, 46. However, the invention is not limited to this order. The process of forming the openings by etching the plurality of insulating layers may be performed after the process of forming the insulating layer 51 over the insulating layer 46. In the case of this order, the insulating layer 51 is formed only in the upper surface of the thin film integrated circuit 52.

Subsequently, the peeling layer 11 is removed by introducing etchant to the openings 49 and 50 (see a cross-sectional view in FIG. 10A and a top view in FIG. 11). A gas or a liquid containing halogen fluoride or interhalogen compound is used for the etchant. For example, chlorine trifluoride (ClF$_3$) is used for the gas containing halogen fluoride. Accordingly, the thin film integrated circuit 52 is peeled from the substrate 10.

In addition, nitrogen trifluoride (NF$_3$); bromine trifluoride (BrF$_3$), or hydrogen fluoride (HF) may be used as the other etchant. In the case of using hydrogen fluoride (HF), a layer containing the oxide of silicon is used as the peeling layer.

Then, one surface of the thin film integrated circuit 52 is attached to a first base material 53 to peel the thin film integrated circuit 52 from the substrate 10 completely (see FIG. 10B).

Subsequently, the other surface of the thin film integrated circuit 52 is attached to a second base material 54. Thereafter, a laminate process is performed so that the thin film integrated circuit 52 is sealed by the first base material 53 and the second base material 54 (see FIG. 1). Accordingly, a wireless chip in which the thin film integrated circuit 52 is sealed by the first base material 53 and the second base material 54 is completed.

The first base material 53 and the second base material 54 each correspond to a laminate film (formed from polypropylene, polyester, vinyl, polyvinyl fluoride, polyvinyl chloride, or the like), paper of a fibrous material, a film in which a base film (polyester, polyamide, an inorganic vapor deposition film, a variety of paper, or the like) and an adhesive synthetic resin film (an acrylic-based synthetic resin, an epoxy-based synthetic resin, or the like) are stacked, or the like.

A laminate film is formed by performing laminate treatment to the subject by thermocompression bonding. In performing a laminate treatment, an adhesive layer provided for the uppermost surface of the laminate film or a layer provided for the outermost layer (not an adhesive layer) is melted by heat treatment to adhere by applying pressure.

The surface of the first base material 53 and the second base material 54 may be provided with an adhesive layer or not. The adhesive layer corresponds to a layer containing an adhesive such as a thermosetting resin, an ultraviolet-curable resin, an epoxy resin-based adhesive agent, or a resin additive agent.

Embodiment 1

In this embodiment, seven samples each used as a peeling layer are formed (see Table 1). The temperature dependence of the etching rate when these samples are etched with the use of a chlorine trifluoride (ClF$_3$) gas is examined. The experimental result is explained with reference to FIG. 25.

TABLE 1

| | | treatment for forming metal oxide film | film thickness (nm) | resistivity (Ωm) |
|---|---|---|---|---|
| sample1 | tungsten oxide layer (WOx) | — | 400 | 4.20E−04 |
| sample2 | stacked layer structure of tungsten layer (W; lower layer) and tungsten oxide layer (WOx; upper layer) | 550° C. 10 min | 50~100 | 2.20E−05 |
| sample3 | stacked layer structure of tungsten layer (W; lower layer) and tungsten oxide layer (WOx; upper layer) | 450° C. 4 min | 50~100 | 1.50E−05 |
| sample4 | tungsten layer (W) | — | 50 | 1.40E−05 |
| sample5 | silicon layer (Si) | — | 50 | — |
| sample6 | silicon layer (Si) | — | 50 | — |
| sample7 | tungsten oxide layer (WO$_3$) | 650° C. 2 min | 70~100 | — |

A method for manufacturing a peeling layer of Samples 1 to 7 is explained below in detail. In Sample 1, a tungsten oxide layer (WO$_x$) is formed in an argon gas and oxygen gas atmosphere by a sputtering method. In Sample 2, a tungsten layer is formed by a sputtering method and subsequently a tungsten oxide layer is formed over the surface of the tungsten layer by LRTA at 550° C. for 10 minutes. In Sample 3, a tungsten layer is formed by a sputtering method and subsequently a tungsten oxide layer is formed over the surface of the tungsten layer by GRTA at 450° C. for 4 minutes. In Sample 4, a tungsten layer is formed by a sputtering method. In Sample 5, a silicon layer is formed by a sputtering method. In Sample 6, a silicon layer is formed by a CVD method. In Sample 7, a tungsten layer is formed by a sputtering method and subsequently a tungsten oxide layer is formed by oxidizing the tungsten layer almost completely by GRTA.

A peeling layer of Sample 1 has a single layer structure formed of a tungsten oxide layer. Peeling layers of Samples 2 and 3 each have a stacked layer structure of a tungsten layer and a tungsten oxide layer over the tungsten layer. A peeling layer of Sample 4 has a single layer structure of a tungsten layer. Peeling layers of Samples 5 and 6 each have a single layer structure of a silicon layer. A peeling layer of Sample 7 has a single layer structure of a tungsten oxide layer. Note that the etching rate in the case of a sample having a stacked layer structure corresponds to the etching rate of the plurality of layers.

Note that the LRTA (Lamp Rapid Thermal Anneal) of Samples 2 and 7 means rapid thermal anneal by a halogen lamp. The GRTA (Gas Rapid Thermal Anneal) of Sample 3 means rapid thermal annealing with radiant heat and gas heated by a diffusion furnace. In Sample 7, the value x of WO$_x$ is specified at 3, which is a result examined by ESCA (electron spectroscopy for chemical analysis). In Samples 1 to 3, the values x of WO$_x$ satisfy 0<x<3, which are considered not to include 3. This is because there is big difference between Samples 1 to 3 and Sample 7 in etching rate. Therefore, the values x of WO$_x$ in Samples 1 to 3 exclude 3, and there can be such cases where the values x are 2 (WO$_2$), where the values x are 2.5 (W$_2$O$_5$), or where the values x are 2.75 (W$_4$O$_{11}$). In addition, the oxidization of the surfaces in Samples 2 and 3 means in Table 1 to form a tungsten oxide layer over the surface of a tungsten layer. Further, the almost complete oxidization of Sample 7 means to make a tungsten layer an almost complete tungsten oxide layer.

Although the values x of $WO_x$ in Samples 1 to 3 satisfy $0<x<3$, which are considered not to include 3, it is considered that various figures is applied to the values x of $WO_x$ in Samples 1 to 3, and it is considered that the values x of $WO_x$ which are the main component of Samples 1 to 3 satisfy $0<x<3$, preferably $2\leq x<3$, in many cases. In other words, there is also the case where Samples 1 to 3 include $WO_3$ in which the values x satisfy 3.

Figure 25:
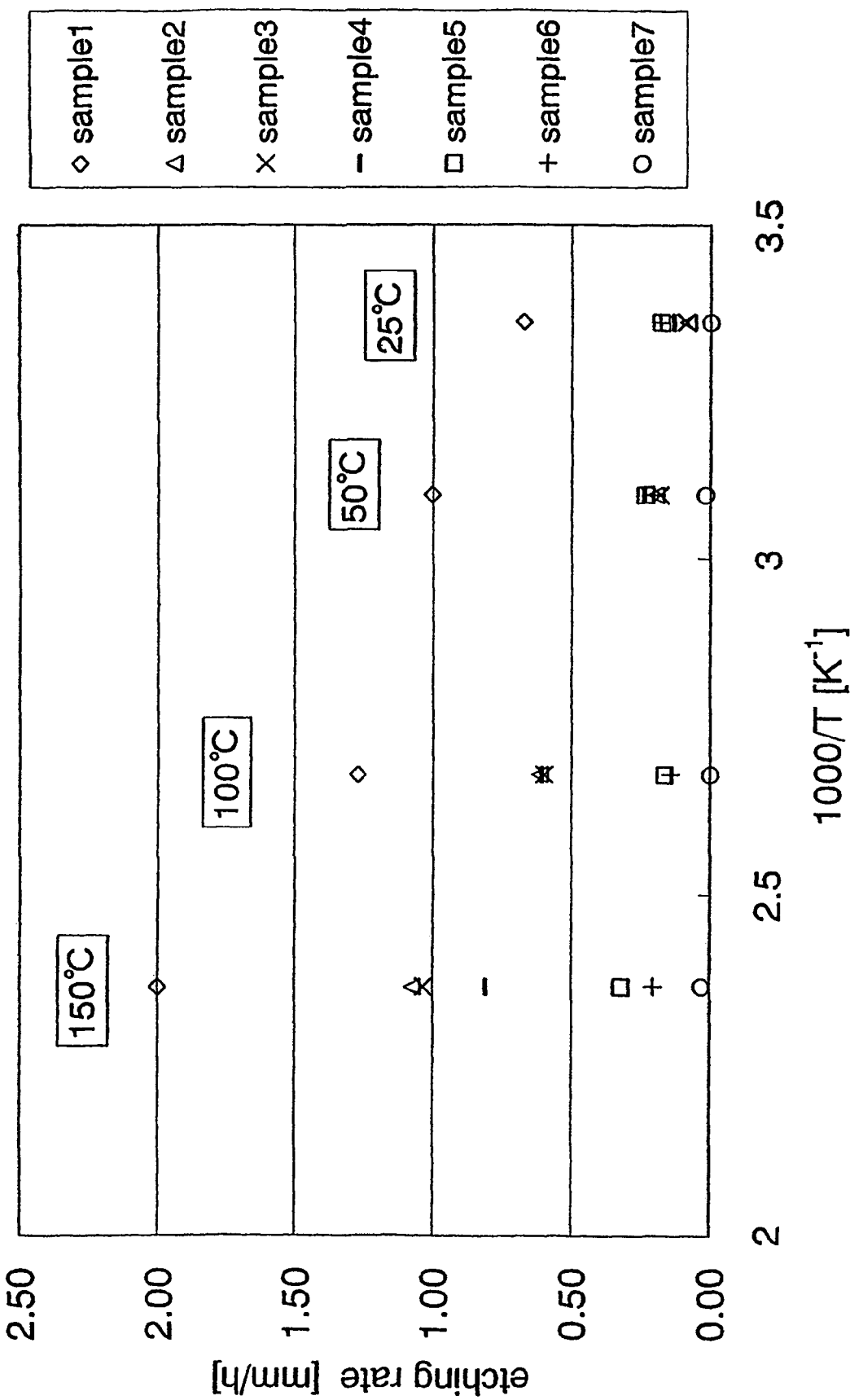
FIG. 25 is a graph showing temperature dependence of an etching rate in a plurality of samples.

In addition, in FIG. 25, a horizontal axis indicates 1000/T (absolute temperature), whose unit is [/K]. A vertical axis indicates an etching rate in each sample, whose unit is [mm/h].

According to FIG. 25, the etching rate at 25° C. which is a room temperature sequentially decreases in the order of Sample 1>Sample 5≈Sample 6>Sample 4>Sample 2≈Sample 3>Sample 7. The etching rate at 50° C. sequentially decreases in the order of Sample 1>Sample 2≈Sample 3≈Sample 4≈Sample 5≈Sample 6>Sample 7. The etching rate at 100° C. sequentially decreases in the order of Sample 1>Sample 2≈Sample 3≈Sample 4>Sample 5≈Sample 6>Sample 7. The etching rate at 150° C. sequentially decreases in the order of Sample 1>Sample 2≈Sample 3>Sample 4>Sample 5>Sample 6>Sample 7.

According to FIG. 25, the etching rate of Sample 1 ($WO_x$) has temperature dependence, and the etching rate gets lower as the temperature gets lower. In addition, the etching rate of Sample 1 takes the highest value as compared with those of other samples. The etching rates of Samples 2 to 4 each have temperature dependence, and the etching rate gets lower as the temperature gets lower in most of the samples. Therefore, it can be understood that Samples 1 to 4 are suitable for a high-temperature treatment.

The etching rates of Sample 5 and Sample 6 each have comparatively small temperature dependence, and the etching rates take almost identical values at either temperature. The etching rate of Sample 7 ($WO_3$) scarcely has temperature dependence, which takes the lowest value as compared with other samples.

The above experiment result proves that it is most suitable to form the same one as Sample 1 as a peeling layer. In addition, it is found that it is preferable to perform etching treatment in as high temperature as possible.

In a method for manufacturing a wireless chip according to the present invention, a peeling layer may be manufactured by the same method as Samples 1 to 7 mentioned above.

Embodiment 2

Figure 11:
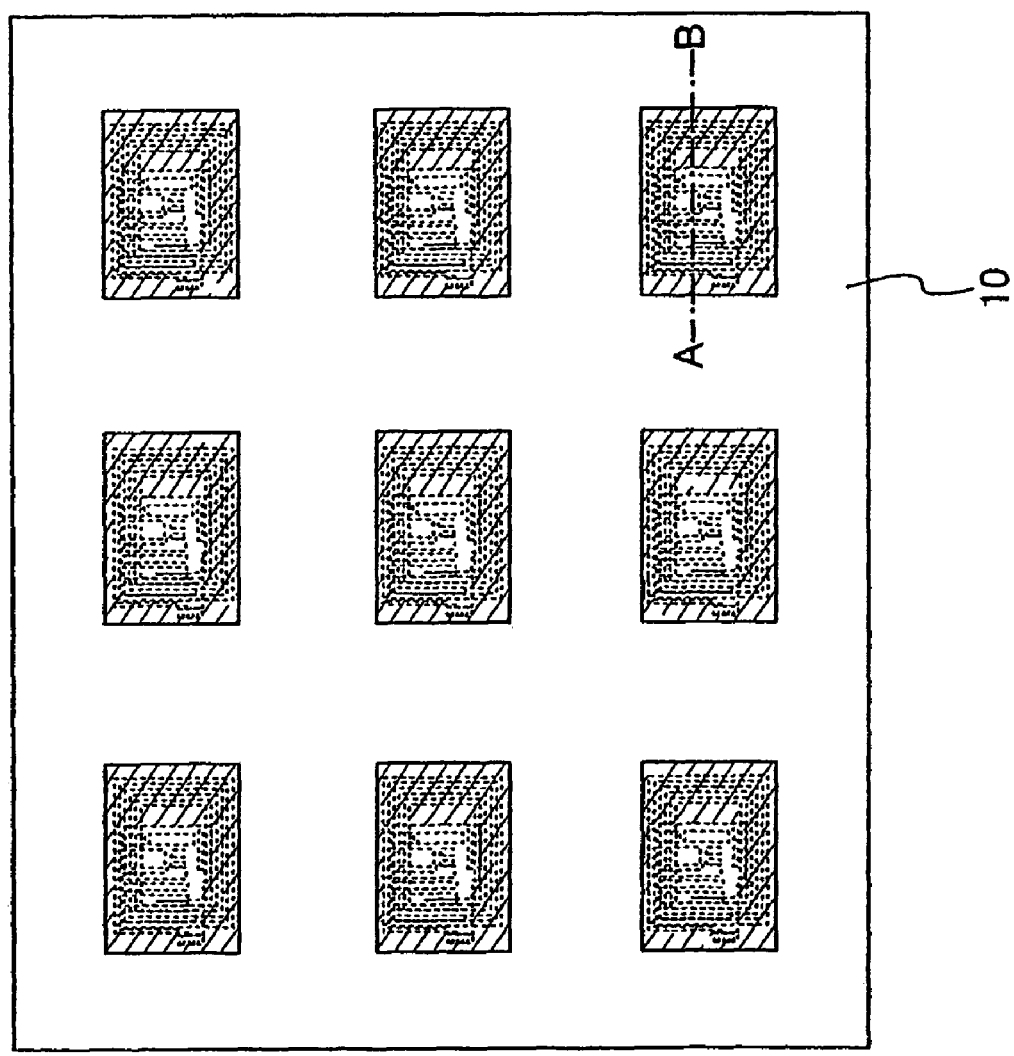
FIG. 11 is a view explaining a wireless chip according to the present invention and a manufacturing method thereof.

According to the above embodiment mode, the peeling layer 11 is removed by etchant completely in order to peel the thin film integrated circuit 52 from the substrate 10 (see FIG. 11). However, the present invention is not limited to this embodiment mode and a peeling layer 11 may be removed selectively instead of removing completely by introducing etchant to openings (see FIG. 18A). Then, after removing the peeling layer 11 selectively, a thin film integrated circuit 52 may be peeled from the substrate 10 by a physical means (physical force) (see FIG. 18B). Note that peeling the thin film integrated circuit 52 by a physical means (physical force) means to peel it by externally applying such a stress as a wind pressure of gas blown from a nozzle or an ultrasonic wave. When the thin film integrated circuit 52 is peeled by a physical means (physical force), the peeling layer 11 may be left over the substrate 10 or both the peeling layer 11 and the thin film integrated circuit 52 may be peeled from the substrate 10.

As mentioned above, the peeling process can be performed within a short time by using a method for removing the peeling layer 11 selectively and jointly using a physical means (physical force) instead of removing the peeling layer 11 completely by etchant; thus, the productivity can be improved.

Embodiment 3

This embodiment will explain a process of forming a minute gate electrode. First, a peeling layer 11, insulating layers 12 to 14, and crystalline semiconductor layers 15 and 16 are formed over a substrate 10 having the insulating surface (see FIG. 19A). Next, conductive layers 70 and 71 are formed over the entire surface (see FIG. 19A). Then, resist masks 72 and 73 are formed over the conductive layer 71 by using a photomask. Subsequently, the resist masks 72 and 73 are etched by a known etching treatment such as oxygen plasma treatment to form new resist masks 74 and 75 (see FIG. 19B). The resist masks 74 and 75 through the above processes can be formed so minute that a limitation in which a resist mask can be formed by a photolithography method is exceeded. When etching treatment is performed by using the resist masks 74 and 75, a minute gate electrode can be formed.

Figure 20A:
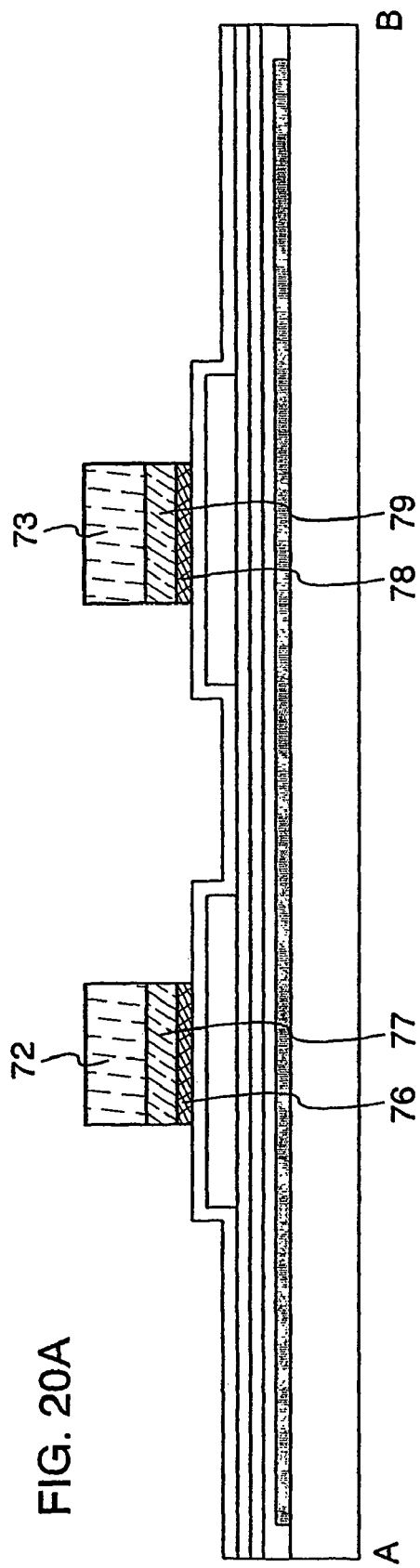
FIGS. 20A and 20B are views each explaining a wireless chip according to the present invention and a manufacturing method thereof.
Figure 20B:
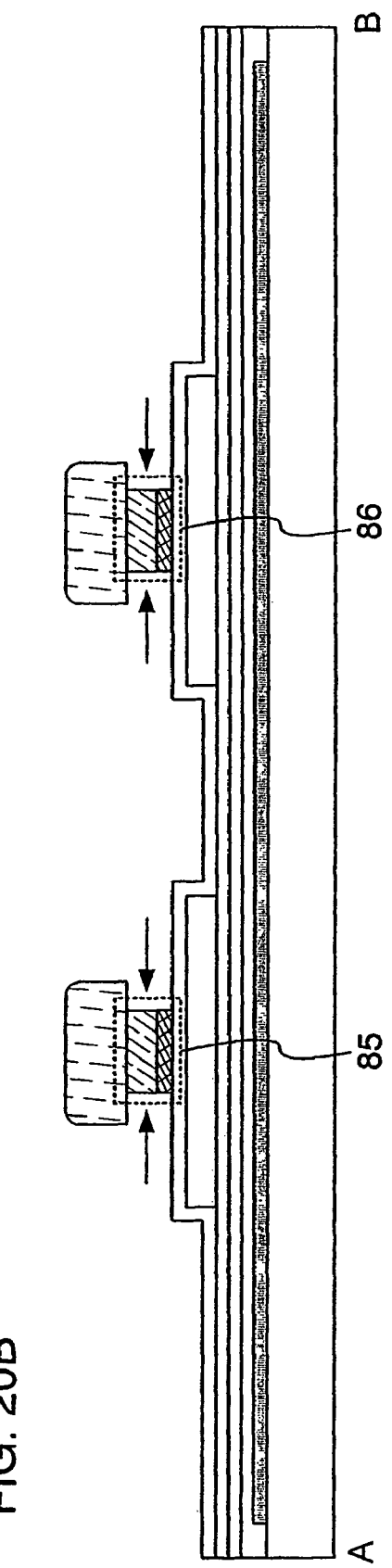

In addition, first, resist masks 72 and 73 are formed by using a photolithography method as a method different from the above (see FIG. 20A). Then, conductive layers 76 to 79 are formed by performing etching treatment with the use of the resist masks 72 and 73. Thereafter, among the stacked layer body of the resist masks 72 and 73 and the conductive layers 76 to 79, only the side surfaces of the conductive layers 76 to 79 are etched selectively without removing the resist masks 72 and 73. Also in this method, as well as in the above method, conductive layers 85 and 86 which function as a gate electrode can be formed so minute that a limitation in which a resist mask can be formed by a photolithography method is exceeded (see FIG. 20B).

A minute thin film transistor can be formed as long as a semiconductor layer is miniaturized along with the minute gate electrode formed by either of the above methods. As long as a thin film transistor is miniaturized, the thin film transistor can be highly integrated for the miniaturization; therefore, high performance is realized. In addition, since the width of a channel forming region is narrowed, a channel is soon generated and thus a high speed operation is realized.

Embodiment 4

This embodiment explains a cross-sectional structure in the case where not only a thin film transistor but also a memory transistor including a floating gate electrode is formed over a substrate having the insulating surface.

Figure 21:
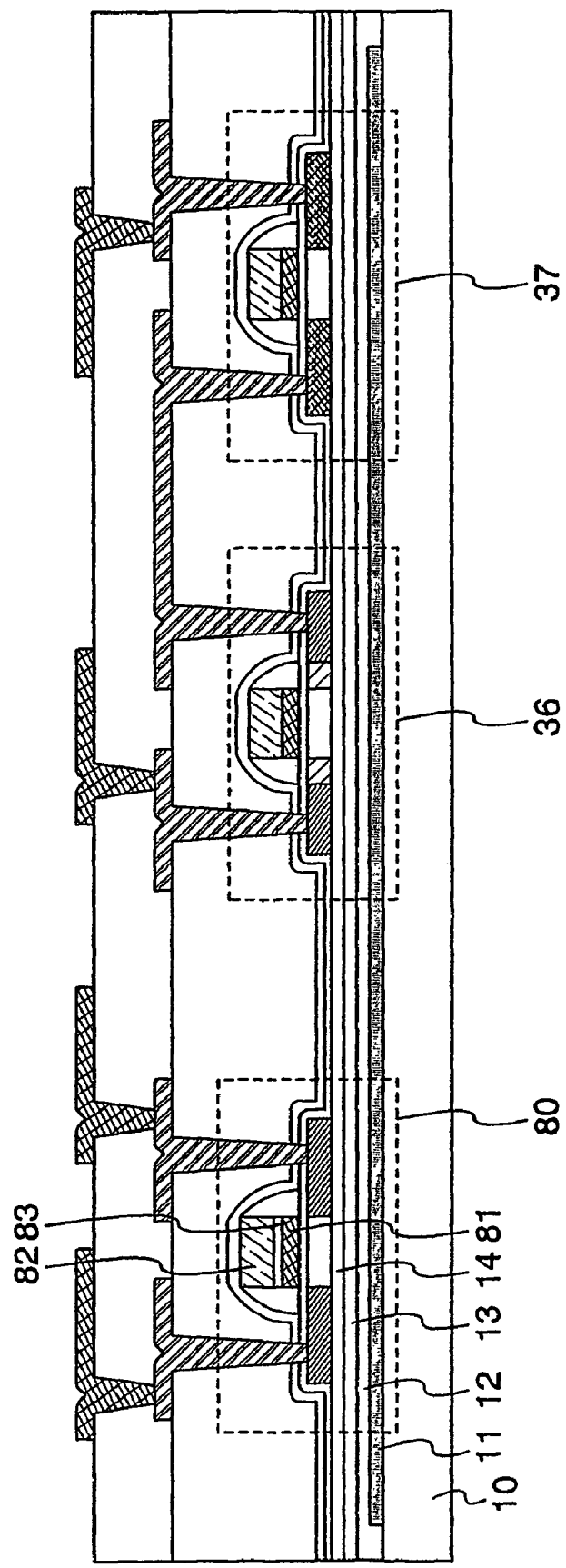
FIG. 21 is a view explaining a structure of a wireless chip according to the present invention.

First, a peeling layer 11 and insulating layers 12 to 14 are formed over a substrate 10 having the insulating surface. Then, thin film transistors 36 and 37 and a memory transistor 80 are formed over the insulating layer 14 (see FIG. 21). The memory transistor 80 has an insulating layer 83 sandwiched between a conductive layer 81 that functions as a gate electrode and a conductive layer 82 that functions as a gate electrode. The conductive layer 81 that functions as an inner gate electrode is electrically isolated, and an electron is stored in this conductive layer 81 and "0" or "1" is distinguished by the electron amount. In the case of the above memory transistor, there is advantage that the memory contents are not lost even when the power supply is cut off. Note that the present invention is not limited to the above embodiment mode using a conductive layer as a gate electrode and, for example, a silicon-cluster layer may also be used as a gate electrode.

Note that not only a EPROM (Electrically Programmable Read Only Memory), an EEPROM (Electrically Erasable Read Only Memory), or a flash memory each including the memory transistor 80 as mentioned above but also a memory such as a DRAM (Dynamic Random Access Memory), an SRAM (Static Random Access Memory), an FeRAM (Ferroelectric Random Access Memory), a mask ROM, a fuse PROM (Programmable Read Only Memory), or an anti-fuse PROM may also be used as the memory circuit.

In addition, if the memory contents of a memory circuit used for a wireless chip are easily rewritten, the wireless chip can be forged. Thus, it is desirable to use a write-once memory that can be written only once. In the write-once memory, it is desirable to use a method for breaking a thin film transistor so that data cannot be written in or to use a method for writing in memory contents with laser light instead of writing in data electrically.

Embodiment 5

Since the power supply of a wireless chip is supplied from an antenna, it is difficult to stabilize the power supply and it is necessary to control the power consumption as much as possible. If the power consumption increases, it is necessary to input an intense electromagnetic wave, which causes disadvantage that, for example, the power consumption of a reader/writer is increased, there is adverse effect on another device or a human body, or a communication distance between a wireless chip and a reader/writer is restricted. Thus, this embodiment explains the structure of a wireless chip capable of controlling the power consumption.

Figure 17:
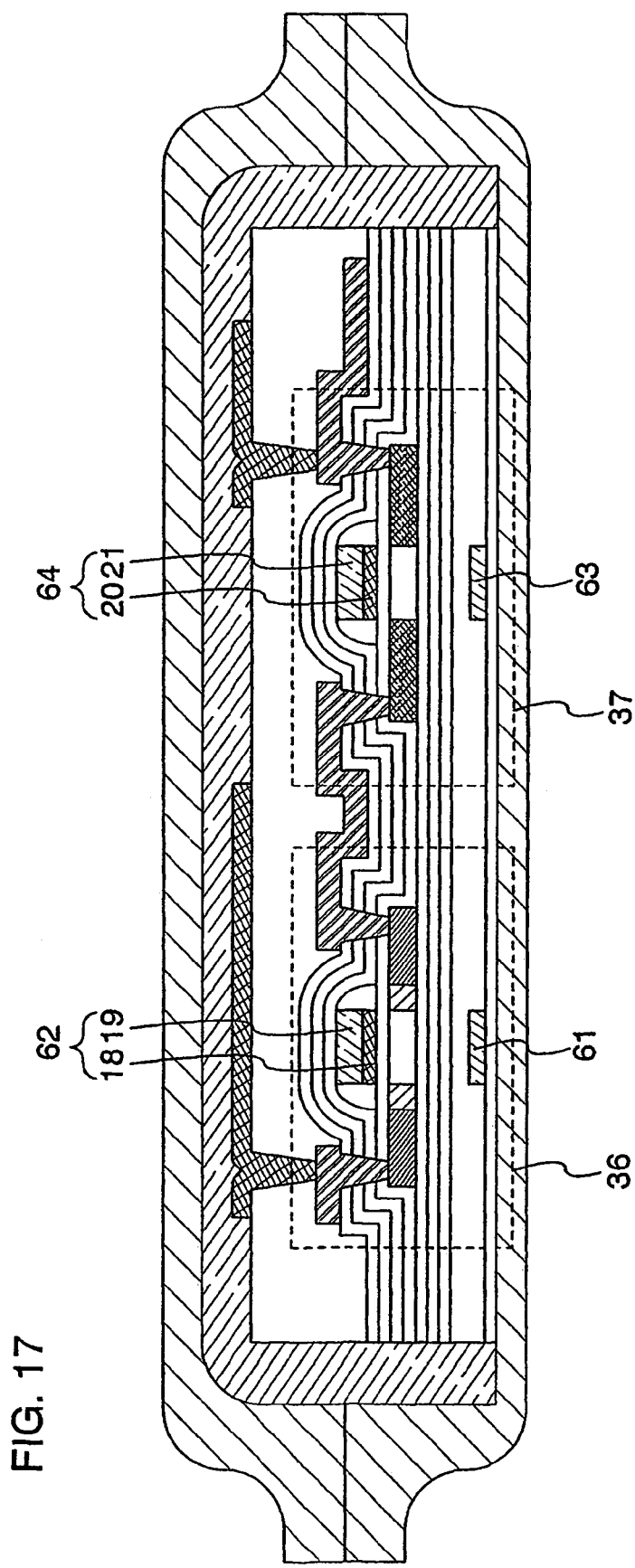
FIG. 17 is a view explaining a wireless chip according to the present invention.

According to one feature of a wireless chip shown in this embodiment, a thin film transistor having a dual-gate structure is used. A thin film transistor having a dual-gate structure is a thin film transistor having a bottom gate electrode and a top gate electrode. FIG. 17 shows an n-type thin film transistor 36 including a bottom gate electrode 61 and a top gate electrode 62 and a p-type thin film transistor 37 including a bottom gate electrode 63 and a top gate electrode 64.

A method for applying a bias voltage to the bottom gate electrodes 61 and 63 is effective in order to control the power consumption. Specifically, applying negative bias voltage to the bottom gate electrode 61 of the n-type thin film transistor 36 enables the threshold voltage to increase and the leakage current to reduce. In addition, applying positive bias voltage enables the threshold voltage to decrease and current to flow easily in a channel forming region. Therefore, the thin film transistor 36 is operated at high speed or at low voltage.

Applying positive bias voltage to the bottom gate electrode 63 of the p-type thin film transistor 37 enables the threshold voltage to increase and the leakage current to reduce. In addition, applying negative bias voltage enables the threshold voltage to decrease and current to flow easily in a channel forming region. Therefore, the thin film transistor 37 is operated at high speed or at low voltage.

As mentioned above, the threshold voltage of the thin film transistors 36 and 37 is changed and the leakage current thereof is reduced by controlling the bias voltage applied to the bottom gate electrode, and as a result, the power consumption of a wireless chip itself can be controlled. Therefore, even when a complicated process such as cipher processing is performed, stabilization of the power supply is realized without destabilization of the power supply. Further, there is no necessity to input an intense electromagnetic wave; thus, the communication distance with a reader/writer can be improved. Note that it is desirable to switch the application of the bias voltage by providing a special control circuit with the power supply through an antenna.

Embodiment 6

This embodiment will explain the structure of a wireless chip according to the present invention with reference to the drawings. The specification of a wireless chip explained here meets ISO standards of 15693, which is a vicinity type and whose communication signal frequency is 13.56 MHz. In addition, the reception responds only to a data readout instruction, the data transmission rate of the transmission is approximately 13 kHz, and a Manchester code is used for a data coded form.

Figure 12:
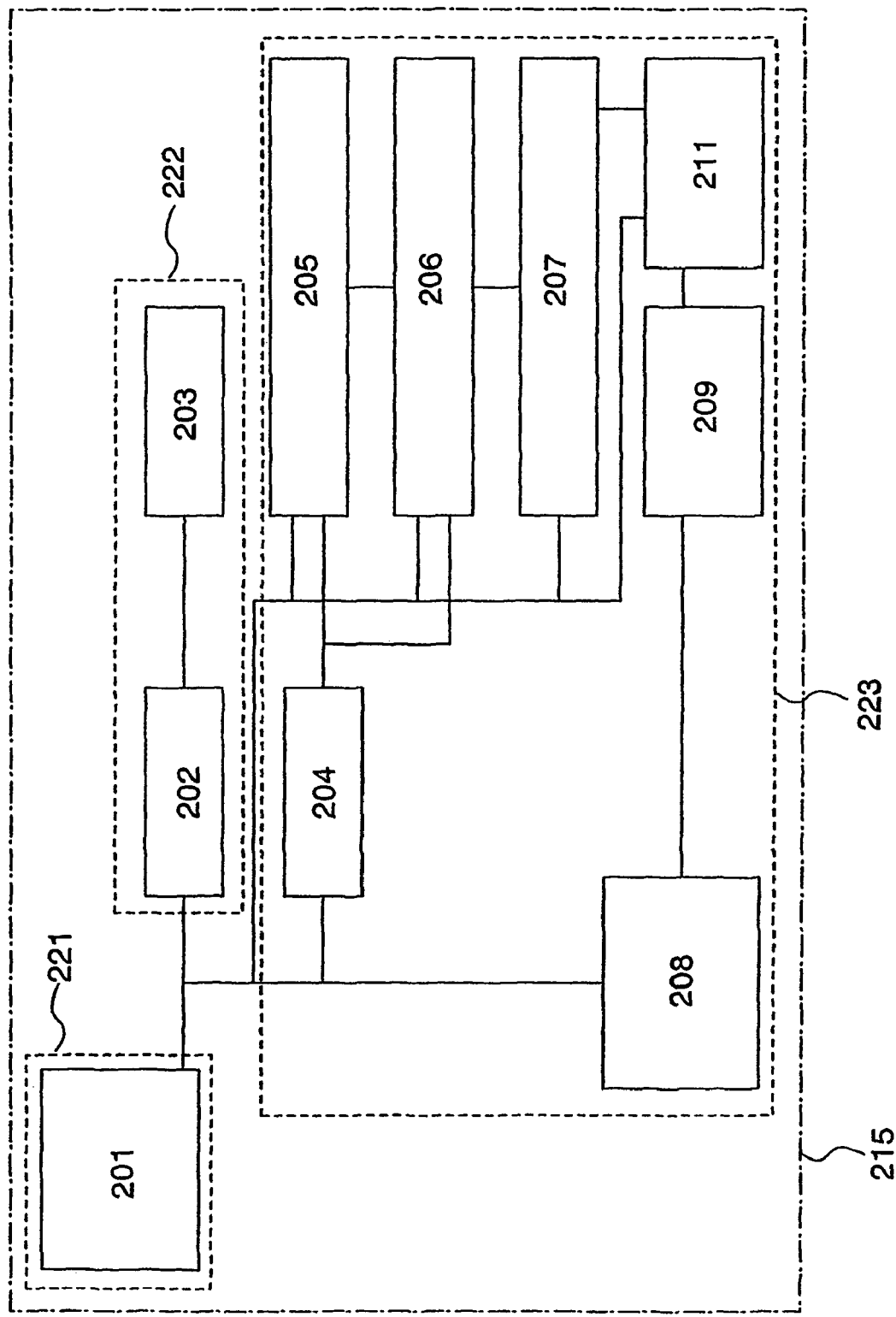
FIG. 12 is a view explaining a structure of a wireless chip according to the present invention.

A wireless chip 215 roughly includes an antenna portion 221, a power supply portion 222, and a logic portion 223. The antenna portion 221 includes an antenna 201 for receiving an external signal and transmitting data (see FIG. 12).

The power supply portion 222 includes a rectifier circuit 202 that creates power supply by a signal externally received via the antenna 201 and a storage capacitor 203 for storing the created power supply.

The logic portion 223 includes a demodulation circuit 204 that demodulates a received signal, a clock generation/compensation circuit 205 that generates a clock signal, a circuit for recognizing and deciding each code 206, a memory controller 207 that creates a signal for reading out data from a memory by a received signal, a modulation circuit comprising modulation resistor 208 that modulate an encoded signal to a transmitted signal, an encoding circuit 209 that encodes a read out data, and a mask ROM 211 that holds data.

A code recognized and decided by the circuit for recognizing and deciding each code 206 is an end of frame (EOF), a start of frame (SOF), a flag, a command code, a mask length, a mask value, or the like. In addition, the circuit for recognizing and deciding each code 206 also includes cyclic redundancy check (CRC) function that identifies a transmission error.

Figure 13:
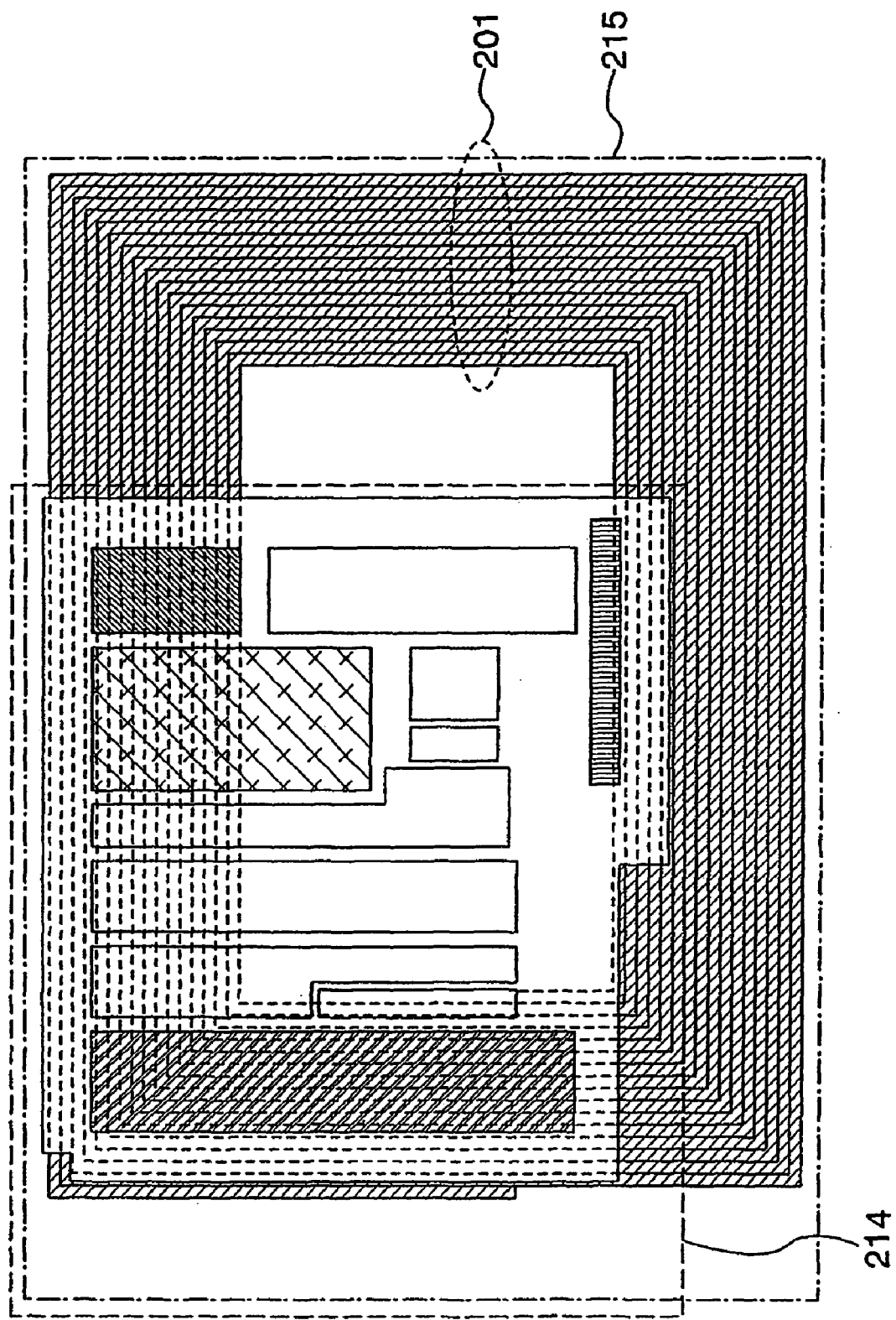
FIG. 13 is a view explaining a structure of a wireless chip according to the present invention.
Figure 14:
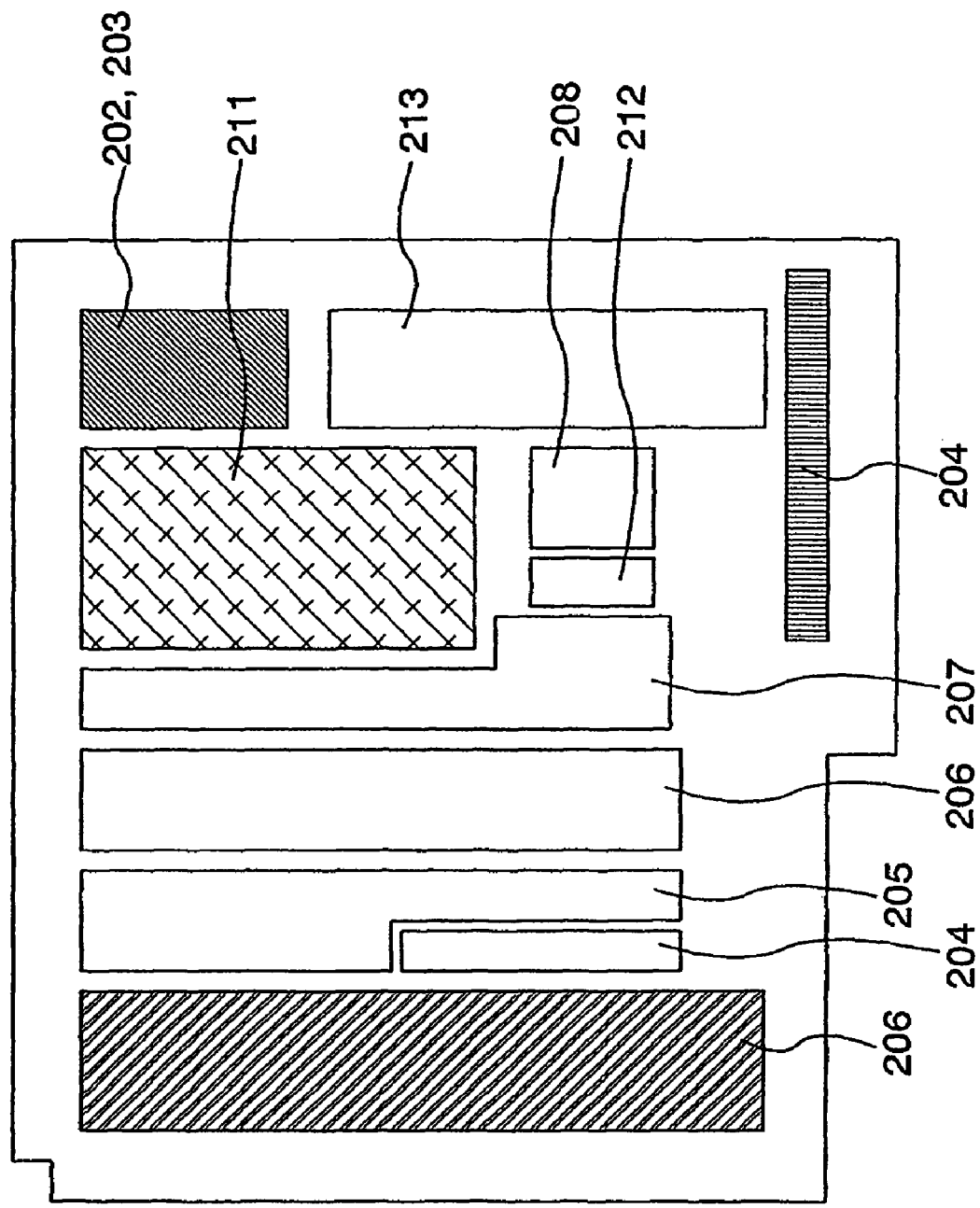
FIG. 14 is a view explaining a structure of a wireless chip according to the present invention.

Next, one example of the layout of a wireless chip having the above structure is explained with reference to FIG. 13 and FIG. 14. First, an overall layout of one wireless chip is explained (see FIG. 13). In the wireless chip, an antenna 201 and an element group 214 including the power supply portion 222 and the logic portion 223 are formed in different layers, and specifically, the antenna 201 is formed over the element group 214. Part of the region where the element group 214 is formed is overlapped with part of the region where the antenna 201 is formed. In the structure shown in FIG. 13, it is designed so that the width of wirings that form the antenna 201 is 150 μm and the width between the wirings is 10 μm, and the number of windings is 15. Note that, as mentioned above, the invention is not limited to a mode in which the antenna 201 and the element group 214 are formed in different layers. In addition, as shown in FIG. 13, the antenna 201 is not limited to a winding shape.

Figure 24A:
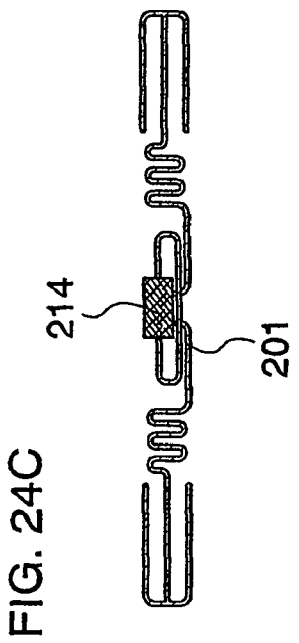
FIGS. 24A to 24D are views each explaining a structure of a wireless chip according to the present invention.
Figure 24C:
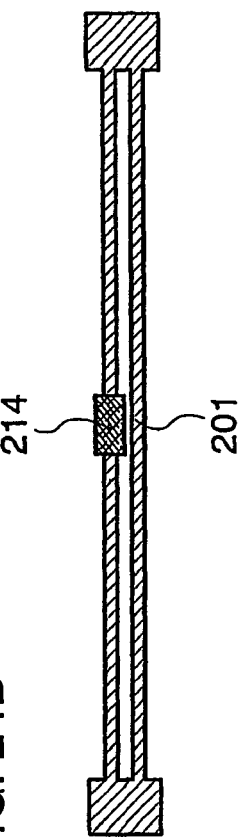
Figure 24B:
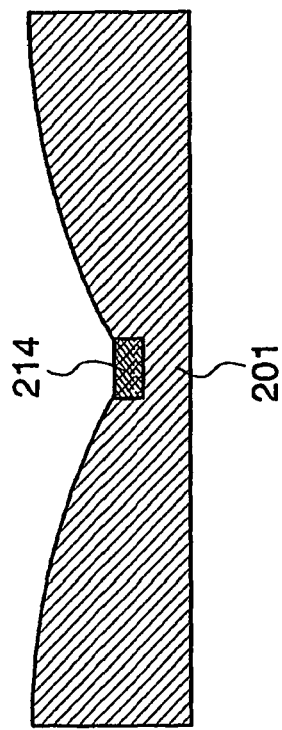
Figure 24D:
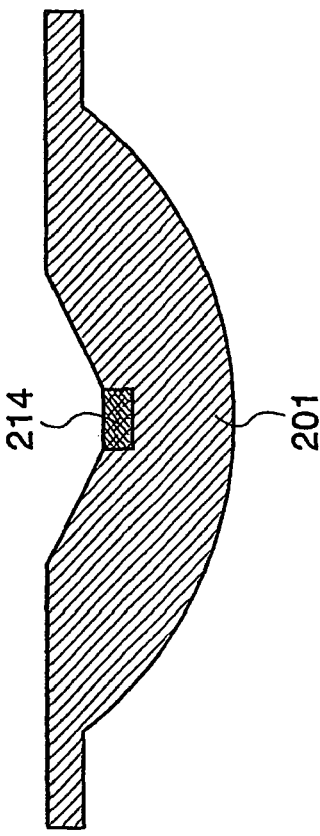

The shape of the antenna 201 may be any one of shapes of a ribbon type (see FIGS. 24A and 24B), a curve type (see FIG. 24C), or a linear type (see FIG. 24D).

Subsequently, the layouts of the power supply portion 222 and the logic portion 223 are explained (see FIG. 14). The rectifier circuit 202 and the storage capacitor 203 included in the power supply portion 222 are provided in the same region. The demodulation circuit 204 and the circuit for recognizing and deciding each code 206 included in the logic portion 223 are provided separately in two places. The mask ROM 211 and the memory controller 207 are provided adjacently. The clock generation/compensation circuit 205 and the circuit for recognizing and deciding each code 206 are provided adjacently. The demodulation circuit 204 is provided between the clock generation/compensation circuit 205 and the circuit for recognizing and deciding each code 206. In addition, although not shown in the block diagram of FIG. 12, a detection capacitor for a logic portion 212 and a detection capacitor for a power supply portion 213 are provided. The modulation circuit comprising modulation resistor 208 is provided between the detection capacitors 212 and 213.

Memory contents are created in a memory by the mask ROM 211 in the manufacturing process. Here, two power supply lines of a power supply line connected to a high-potential power supply (also referred to as VDD) and a power supply line connected to a low-potential power supply (also referred to as VSS) are provided, and whether a transistor included in each memory cell is connected to either of the above power supply lines determines the memory contents stored by a memory cell.

Figure 22A:
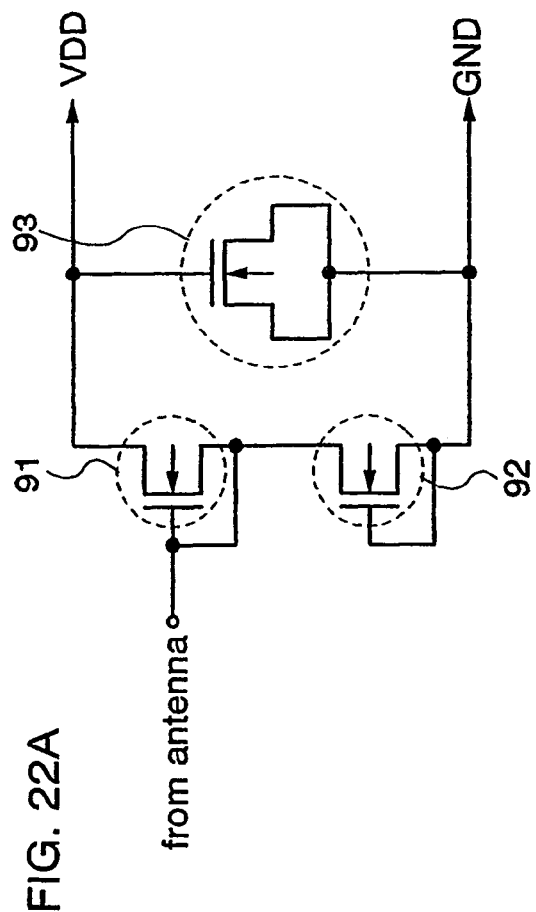
FIGS. 22A and 22B are diagrams each explaining a structure of a wireless chip according to the present invention.

Then, one example of the circuit configuration of the rectifier circuit 202 is explained (see FIG. 22A). The rectifier circuit 202 has transistors 91 and 92 and a capacitor transistor 93. The gate electrode of the transistor 91 is connected to an antenna 201. The gate electrode of the capacitor transistor 93 is connected to a high-potential power supply (VDD). In addition, the source and drain electrodes of the capacitor transistor 93 are connected to a ground power supply (GND).

Figure 22B:
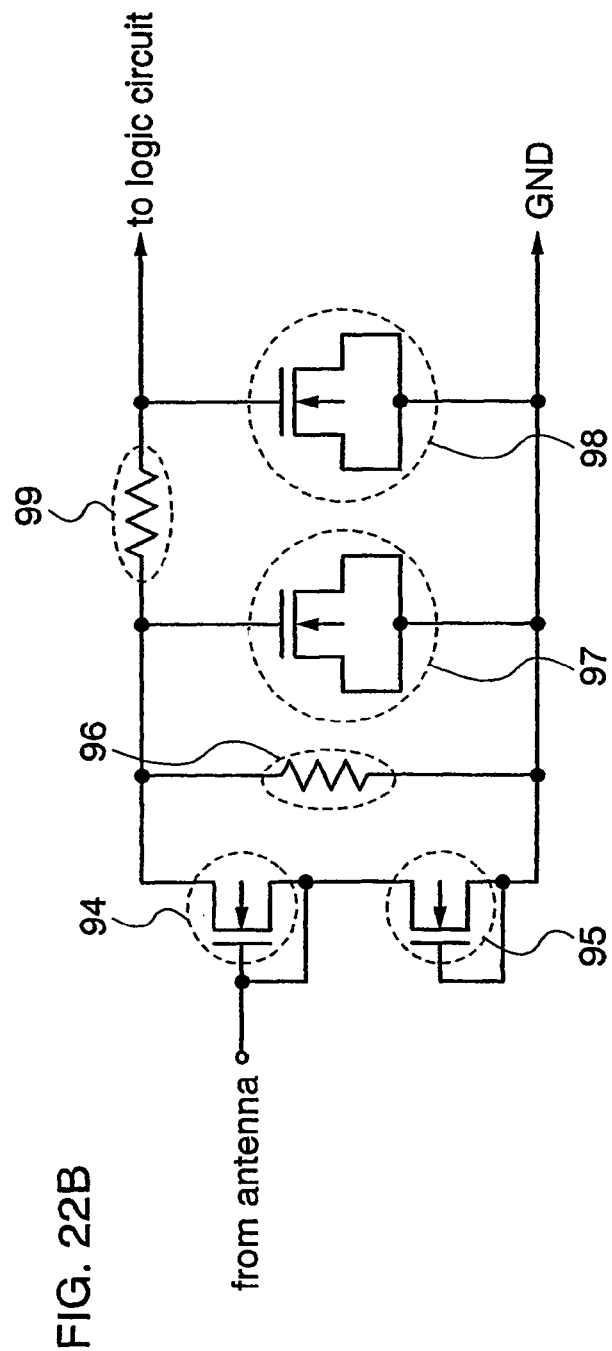

Subsequently, one example of the circuit configuration of the demodulation circuit 204 is explained (see FIG. 22B). The demodulation circuit 204 has transistors 94 and 95, resistance elements 96 and 99, and capacitor transistors 97 and 98. The gate electrode of the transistor 94 is connected to an antenna 201. The gate electrode of the capacitor transistor 98 is connected to a logic circuit. The source and drain electrodes of the capacitor transistor 98 are connected to a ground power supply (GND).

Figure 23B:
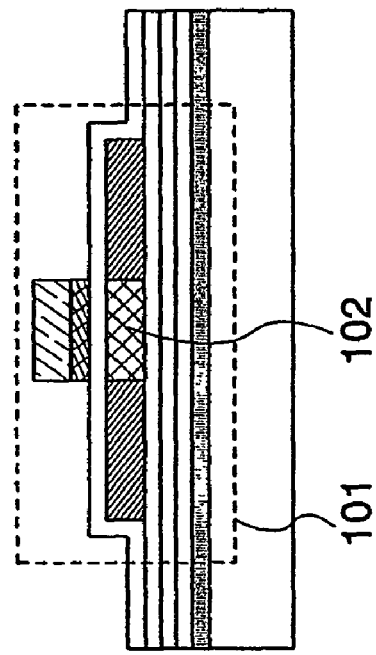
FIGS. 23A to 23D are views each explaining a structure of a wireless chip according to the present invention.
Figure 23D:
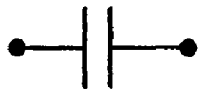
Figure 23A:
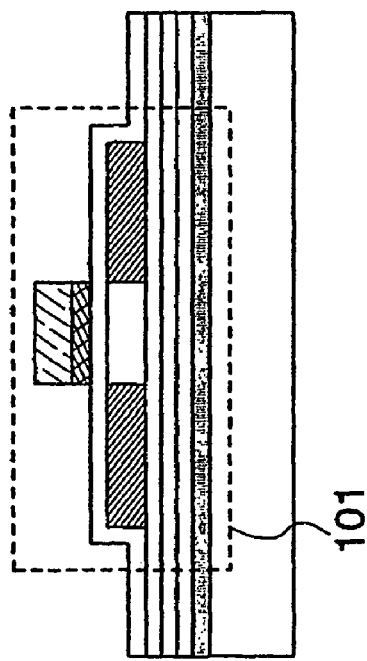
Figure 23C:
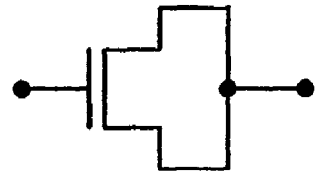

Then, the cross-sectional structure of a capacitor transistor included in the above rectifier circuit 202 and demodulation circuit 204 will be explained (see FIG. 23A). The source and drain electrodes of a capacitor transistor 101 are connected to each other, and when the capacitor transistor 101 is turned ON, a capacitor is formed between the gate electrode and the channel forming region. Such a cross-sectional structure of the capacitor transistor 101 is the same as the cross-sectional structure of a usual thin film transistor. The equivalent circuit diagram can be shown as in FIG. 23B. In the capacitor using a gate insulating film as in the above structure, the capacitance is influenced due to the fluctuation of the threshold voltage of the transistor; therefore, a region 102 overlapped with the gate electrode may be added with an impurity element (see FIG. 23C). Accordingly, the capacitor is formed regardless of the threshold voltage of the transistor. The equivalent circuit diagram in this case can be shown as in FIG. 23D.

This embodiment can be arbitrarily combined with the above embodiment mode and embodiments.

Embodiment 7

Figure 15B:
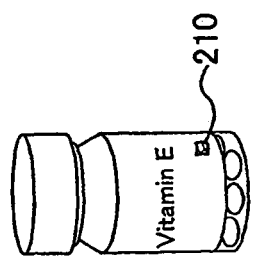
FIGS. 15A to 15E are views each explaining usage patterns of a wireless chip according to the present invention.
Figure 15A:
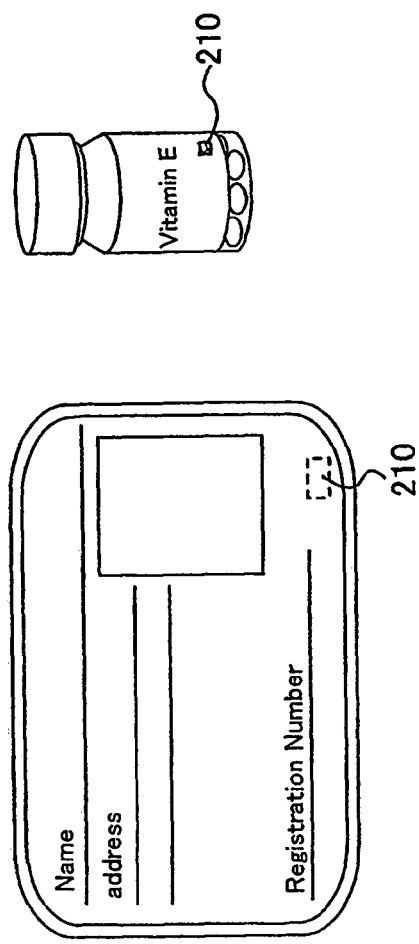
Figure 15E:
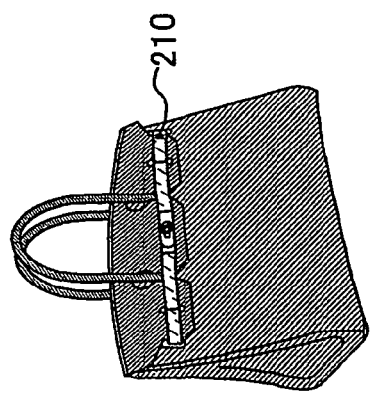
Figure 15D:
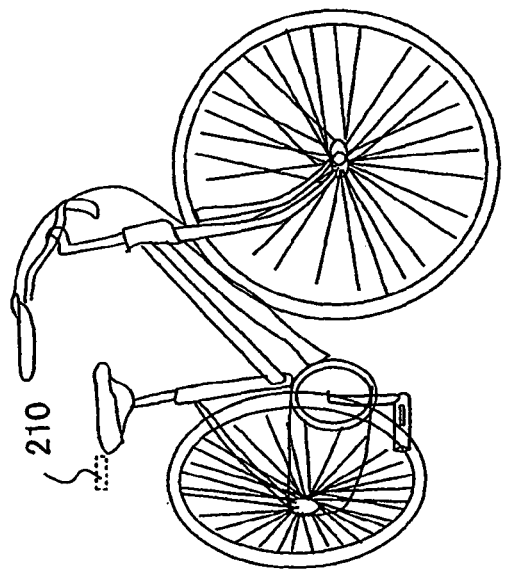
Figure 15C:
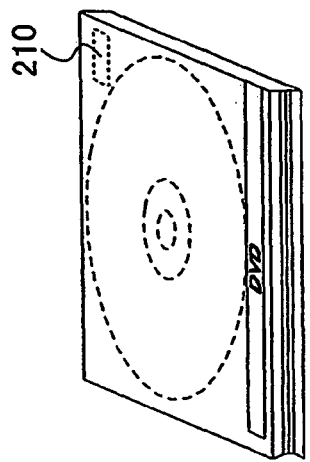

The application of a wireless chip manufactured according to the present invention ranges extensively. The wireless chip can be used by being attached to, for example, a bill, a coin, securities, bearer bonds, or certificates (a driver's license, a residence certificate, or the like; see FIG. 15A), wrapping items (wrapping paper, a bottle, or the like; see FIG. 15B), a recording medium (DVD software, a video tape, or the like; see FIG. 15C), vehicles (a bicycle or the like; see FIG. 15D), accessories (a bag, glasses, or the like; see FIG. 15E), foodstuffs, clothes, living wares, electronic devices, or the like. An electronic device is a liquid crystal display device, an EL display device, a television device (also just referred to as a television or a television receiver), a cellular phone, or the like.

A wireless chip 210 is fixed to articles by being attached to the surface thereof or mounted thereon. For example, a wireless chip 210 is mounted on the base paper of a book cover and on organic resin of a package made therefrom. In addition, a wireless chip 210 is attached to and mounted on the surface of a bill, a coin, securities, bearer bonds, certificates, or the like.

The efficiency of an inspection system, a system at a rental shop, or the like can be promoted by providing a wireless chip for, for example, wrapping items, a recording medium, personal items, foodstuffs, clothes, living wares, electronic devices, or the like among the above articles.

Figure 16A:
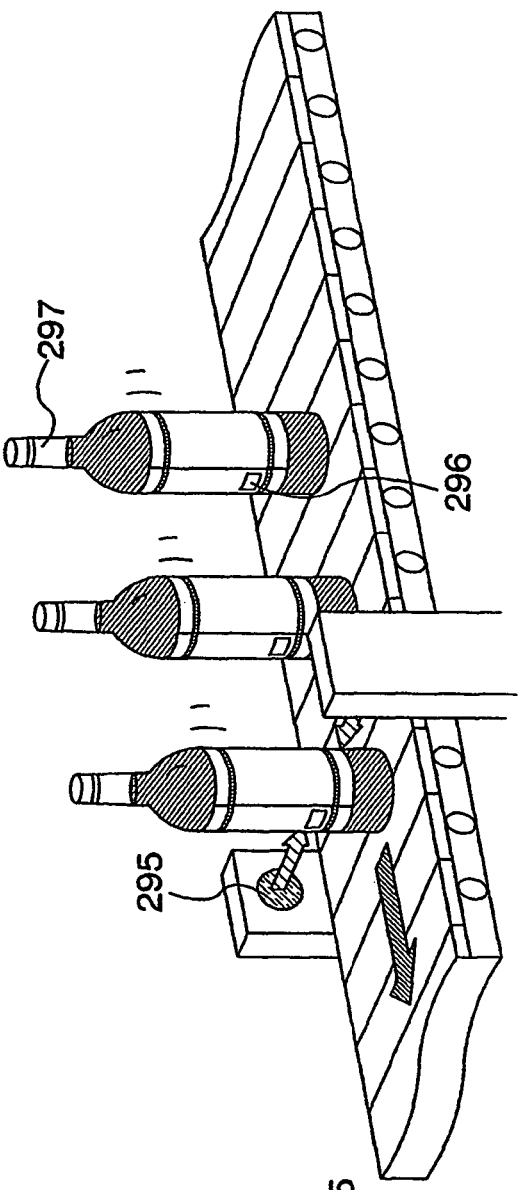
FIGS. 16A and 16B are views each explaining usage patterns of a wireless chip according to the present invention.
Figure 16B:
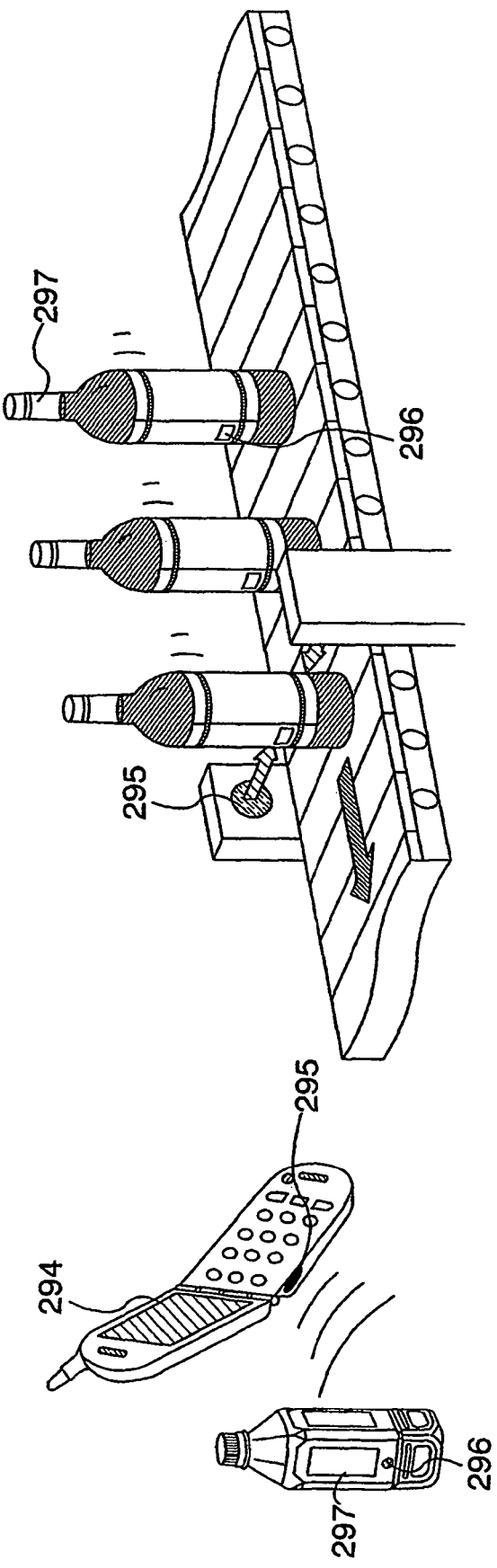

In addition, a sophisticated system can be realized by applying the wireless chip to a system for controlling an article or a distribution system. For example, there is the case where a reader/writer 295 is provided on the side surface of a portable terminal including a display portion 294 and a wireless chip 296 is provided on the side surface of an article 297 (see FIG. 16A). In this case, when the wireless chip 296 is held over the reader/writer 295, the system displays information of the article 297 on raw materials, origins, records of a distribution process, or the like in the display portion 294. As another example, there is the case where the reader/writer 295 is provided on the side of a belt conveyor (see FIG. 16B). In this case, the article 297 can be inspected easily.

This embodiment can be arbitrarily combined with the above embodiment mode and embodiments.

Embodiment 8

Figure 26:
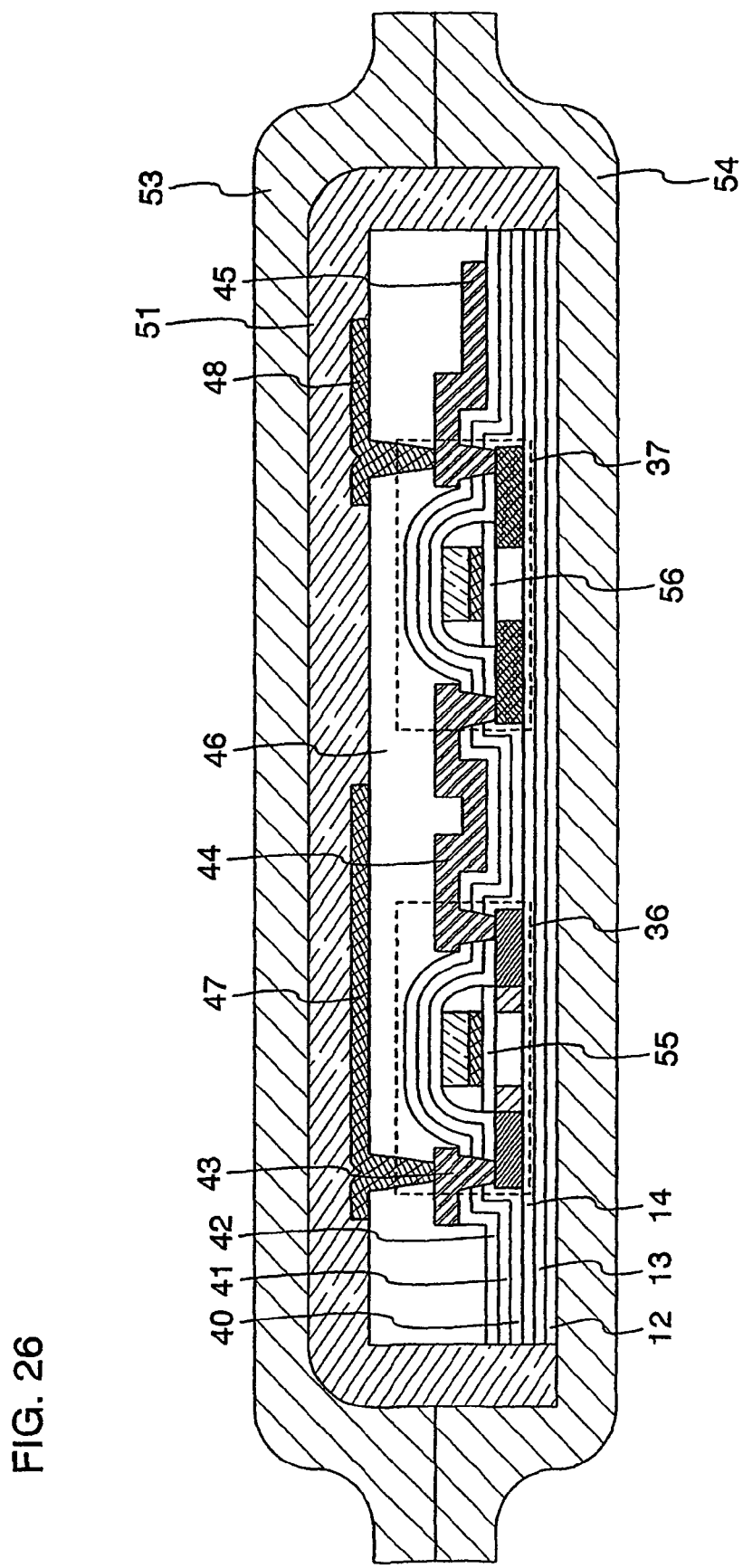
FIG. 26 is a view explaining a structure of a wireless chip according to the present invention.

This embodiment explains the cross-sectional structure of a wireless chip different from the above with reference to FIG. 26. In a wireless chip according to the present invention, a thin film integrated circuit is provided between a first base material 53 (can also be referred to as a substrate, a film, or a tape) and a second base material 54. The thin film integrated circuit has insulating layers 12 to 14, thin film transistors 36 and 37 provided over the insulating layers 12 to 14, insulating layers 40 to 42 covering the thin film transistors 36 and 37, conductive layers 43 to 45 being in contact with the insulating layers 40 to 42 and functioning as a source or drain wiring, an insulating layer 46 covering the conductive layers 43 to 45, conductive layers 47 and 48 being in contact with the insulating layer 46 and functioning as an antenna, and an insulating layer 51 covering the conductive layers 47 and 48. The first base material 53 is provided to be in contact with the insulating layer 51, and the second base material 54 is provided to be in contact with the insulating layer 12.

Each of the thin film transistors 36 and 37 has a semiconductor layer, a gate insulating layer, and a gate electrode layer. In the structure shown in FIG. 26, gate insulating layers 55 and 56 are each provided to only overlap with a gate electrode layer and a sidewall insulating layer. This is obtained when a gate insulating layer 17 is also etched simultaneously in forming an insulating layer 28 (see FIG. 4B) and then etching the insulating layer 28 selectively by anisotropic etching which is mainly for the vertical direction to form sidewall insulating layers 29 and 30 being in contact with the side surface of a gate electrode layer (see FIG. 5A). In other words, the gate insulating layers 55 and 56 are formed by etching the gate insulating layer 17 in forming the sidewall insulating layers 29 and 30.

Although there is a single-gate structure having one gate electrode and a multi-gate structure having two gate electrodes or more in a thin film transistor, either structure may be applied to a thin film transistor used in the invention. In the case of a transistor having two gate electrodes, a semiconductor layer included in the thin film transistor has two channel forming regions. A thin film transistor included in a wireless chip of the invention has a feature that the channel length ranges from 1 μm to 3 μm. However, in the case of a thin film transistor having two channel forming regions, the channel length corresponds to the total length of the channel length of the two channel forming regions.

This application is based on Japanese Patent Application serial no. 2004-242994 filed in Japan Patent Office on Aug. 23, 2004, the entire contents of which are hereby incorporated by reference.

The invention claimed is:

1. A thin film integrated circuit comprising:
   a first insulating layer;
   at least a first transistor and a second transistor provided over the first insulating layer;
   a second insulating layer covering the first transistor and the second transistor;
   a first conductive layer over the second insulating layer and functioning as at least one of a source wiring and a drain wiring;
   a third insulating layer covering the first conductive layer;
   an antenna comprising a second conductive layer over the third insulating layer;
   a fourth insulating layer covering the antenna,
   wherein a first semiconductor layer included in the first transistor has a first channel forming region and a first impurity region,
   wherein a second semiconductor layer included in the second transistor has a second channel forming region and a second impurity region,
   wherein the thin film integrated circuit is provided between a first base material and a second base material, and
   wherein the first base material is in contact with the second base material at an edge portion of the first base material and the second base material.

2. A thin film integrated circuit comprising:
   a first insulating layer;
   at least a first transistor and a second transistor provided over the first insulating layer;
   a second insulating layer covering the first transistor and the second transistor;
   a first conductive layer over the second insulating layer and functioning as at least one of a source wiring and a drain wiring;
   a third insulating layer covering the first conductive layer;
   an antenna comprising a second conductive layer over the third insulating layer;
   a fourth insulating layer covering the antenna,
   wherein the first transistor has a sidewall insulating layer,
   wherein a first semiconductor layer included in the first transistor has a first channel forming region, a first impurity region, and a second impurity region,
   wherein a second semiconductor layer included in the second transistor has a second channel forming region and a third impurity region,
   wherein the concentration of an impurity element in the first impurity region is lower than the concentration of an impurity element in the second impurity region,
   wherein the sidewall insulating layer is in contact with a side surface of a gate electrode layer and is overlapped with the first impurity region,
   wherein the thin film integrated circuit is provided between a first base material and a second base material, and
   wherein the first base material is in contact with the second base material at an edge portion of the first base material and the second base material.

3. The thin film integrated circuit according to claim 1 or 2, wherein each channel length of the first semiconductor layer and the second semiconductor layer is 1 μm to 3 μm.

4. The thin film integrated circuit according to claim 1 or 2, wherein a gate electrode included in each of the first transistor and the second transistor comprises a tantalum nitride layer and a tungsten layer over the tantalum nitride layer.

5. The thin film integrated circuit according to claim 1 or 2, wherein the first conductive layer comprises a first titanium layer, an aluminum layer added with silicon over the first titanium layer, and a second titanium layer over the aluminum layer added with silicon.

6. The thin film integrated circuit according to claim 1 or 2, wherein the first conductive layer comprises a titanium nitride layer, a first titanium layer over the titanium nitride layer, an aluminum layer over the first titanium layer, and a second titanium layer over the aluminum layer.

7. The thin film integrated circuit according to claim 1 or 2, wherein the second conductive layer comprises an aluminum layer.

8. The thin film integrated circuit according to claim 1 or 2, wherein the second conductive layer comprises a titanium layer and an aluminum layer over the titanium layer.

9. The thin film integrated circuit according to claim 1 or 2, wherein the first insulating layer comprises a silicon oxide layer, a silicon nitride oxide layer over the silicon oxide layer, and a silicon oxynitride layer over the silicon nitride oxide layer.

10. The thin film integrated circuit according to claim 1 or 2, wherein the first insulating layer comprises a first silicon oxynitride layer, a silicon nitride oxide layer over the first silicon oxynitride layer, and a second silicon oxynitride layer over the silicon nitride oxide layer.

11. The thin film integrated circuit according to claim 1 or 2, wherein the first insulating layer comprises a silicon nitride oxide layer and silicon oxynitride layer over the silicon nitride oxide layer.

12. The thin film integrated circuit according to claim 1 or 2, wherein the second insulating layer comprises an inorganic layer of a single layer or a stacked layer.

13. The thin film integrated circuit according to claim 1 or 2, wherein the third insulating layer comprises an organic layer and an inorganic layer over the organic layer.

14. The thin film integrated circuit according to claim 1 or 2, wherein the third insulating layer comprises an inorganic layer of a single layer or a stacked layer.

15. The thin film integrated circuit according to claim 1 or 2, wherein the fourth insulating layer comprises an organic layer.

16. The thin film integrated circuit according to claim 1 or 2, wherein one or both of the first base material and the second base material comprise an adhesive layer on one surface.

17. A semiconductor device comprising:
    a first film;
    a first insulating film over the first film;
    an integrated circuit comprising a transistor and an antenna over the first insulating film;
    a second insulating film covering the integrated circuit; and
    a second film covering the second insulating film,
    wherein the first film is in contact with the second film at an edge portion of the first film and the second film.

18. The semiconductor device according to claim 17, wherein the first film and the second film include a fibrous material.

19. The semiconductor device according to claim 17, wherein the first film and the second film include a resin.

20. The semiconductor device according to claim 17, wherein the first insulating film includes a material selected from the group consisting of silicon oxide, silicon nitride, silicon oxynitride, and silicon nitride oxide.

21. The semiconductor device according to claim 17, wherein the integrated circuit comprises a write-once memory.

22. The semiconductor device according to claim 17, wherein the second insulating film includes an organic material.

23. The semiconductor device according to claim 17, wherein the integrated circuit comprises a memory transistor.

24. The semiconductor device according to claim 23, wherein the memory transistor includes a floating gate electrode.

25. A semiconductor device comprising:
a first film;
a first insulating film over the first film;
an integrated circuit comprising a transistor and an antenna over the first insulating film;
a second insulating film covering the integrated circuit; and
a second film covering the second insulating film,
wherein the first insulating film is in contact with the second insulating film at an edge portion of the first insulating film and the second insulating film, and
wherein the first film is in contact with the second film at an edge portion of the first film and the second film.

26. The semiconductor device according to claim 25, wherein the first film and the second film include a fibrous material.

27. The semiconductor device according to claim 25, wherein the first film and the second film include a resin.

28. The semiconductor device according to claim 25, wherein the first insulating film includes a material selected from the group consisting of silicon oxide, silicon nitride, silicon oxynitride, and silicon nitride oxide.

29. The semiconductor device according to claim 25, wherein the integrated circuit comprises a write-once memory.

30. The semiconductor device according to claim 25, wherein the second insulating film includes an organic material.

31. The semiconductor device according to claim 25, wherein the integrated circuit comprises a memory transistor.

32. The semiconductor device according to claim 31, wherein the memory transistor includes a floating gate electrode.

33. A semiconductor device comprising:
a first film;
an integrated circuit over the first film, comprising:
 a first insulating film;
 a transistor over the first insulating film;
 a second insulating film over the transistor;
 an antenna over the second insulating film; and
 a third insulating film over the antenna; and
a second film covering the integrated circuit,
 wherein the first film is in contact with the second film at an edge portion of the first film and the second film.

34. The semiconductor device according to claim 33, wherein the first film and the second film include a fibrous material.

35. The semiconductor device according to claim 33, wherein the first film and the second film include a resin.

36. The semiconductor device according to claim 33, wherein the first insulating film includes a material selected from the group consisting of silicon oxide, silicon nitride, silicon oxynitride, and silicon nitride oxide.

37. The semiconductor device according to claim 33, wherein the integrated circuit comprises a write-once memory.

38. The semiconductor device according to claim 33, wherein the second insulating film includes an organic material.

39. The semiconductor device according to claim 33, wherein the integrated circuit comprises a memory transistor.

40. The semiconductor device according to claim 39, wherein the memory transistor includes a floating gate electrode.

41. A semiconductor device comprising:
a first film;
an integrated circuit over the first film, comprising:
 a first insulating film;
 a transistor over the first insulating film;
 a second insulating film over the transistor;
 an antenna over the second insulating film; and
 a third insulating film over the antenna; and
a second film covering the integrated circuit,
 wherein the first insulating film is in contact with the second insulating film at an edge portion of the first insulating film and the second insulating film, and
 wherein the first film is in contact with the second film at an edge portion of the first film and the second film.

42. The semiconductor device according to claim 41, wherein the first film and the second film include a fibrous material.

43. The semiconductor device according to claim 41, wherein the first film and the second film include a resin.

44. The semiconductor device according to claim 41, wherein the first insulating film includes a material selected from the group consisting of silicon oxide, silicon nitride, silicon oxynitride, and silicon nitride oxide.

45. The semiconductor device according to claim 41, wherein the integrated circuit comprises a write-once memory.

46. The semiconductor device according to claim 41, wherein the second insulating film includes an organic material.

47. The semiconductor device according to claim 41, wherein the integrated circuit comprises a memory transistor.

48. The semiconductor device according to claim 47, wherein the memory transistor includes a floating gate electrode.

* * * * *